US011986853B2

(12) United States Patent
Tanaka et al.

(10) Patent No.: US 11,986,853 B2
(45) Date of Patent: May 21, 2024

(54) SUBSTRATE PROCESSING APPARATUS, FILM FORMATION UNIT, SUBSTRATE PROCESSING METHOD AND FILM FORMATION METHOD

(71) Applicant: SCREEN Holdings Co., Ltd., Kyoto (JP)

(72) Inventors: Yuji Tanaka, Kyoto (JP); Masaya Asai, Kyoto (JP); Masahiko Harumoto, Kyoto (JP); Koji Kaneyama, Kyoto (JP)

(73) Assignee: SCREEN HOLDINGS CO., LTD. (JP)

( * ) Notice: Subject to any disclaimer, the term of this patent is extended or adjusted under 35 U.S.C. 154(b) by 414 days.

(21) Appl. No.: 17/090,983

(22) Filed: Nov. 6, 2020

(65) Prior Publication Data

US 2021/0078036 A1     Mar. 18, 2021

Related U.S. Application Data

(62) Division of application No. 15/579,505, filed as application No. PCT/JP2016/002059 on Apr. 15, 2016, now abandoned.

(30) Foreign Application Priority Data

Jun. 3, 2015   (JP) ................................. 2015-112811
Nov. 10, 2015   (JP) ................................. 2015-220497

(51) Int. Cl.
    *B05D 1/00*          (2006.01)
    *B05C 11/08*        (2006.01)
    (Continued)

(52) U.S. Cl.
    CPC .............. *B05D 1/005* (2013.01); *B05C 11/08* (2013.01); *B05C 11/10* (2013.01);
    (Continued)

(58) Field of Classification Search
None
See application file for complete search history.

(56) References Cited

U.S. PATENT DOCUMENTS 5,487,398 A     1/1996   Ohmi et al. ................. 134/95.1
5,688,411 A    11/1997   Kutsuzawa et al. ............ 216/92
(Continued)

FOREIGN PATENT DOCUMENTS

CN     1432440 A     7/2003
CN     1432531 A     7/2003
(Continued)

OTHER PUBLICATIONS

Office Action dated Aug. 24, 2020 in counterpart Chinese Patent Application No. 201680031649.7.
(Continued)

*Primary Examiner* — Shamim Ahmed
*Assistant Examiner* — Bradford M Gates
(74) *Attorney, Agent, or Firm* — OSTROLENK FABER LLP

(57) ABSTRACT

A coating liquid containing metal as a metal-containing coating liquid is supplied to a surface to be processed of a substrate by a coating processing unit, whereby a metal-containing coating film is formed on the surface to be processed. The substrate on which the metal-containing coating film has been formed is transported to a metal removal unit by a transport mechanism. A removal liquid for dissolving the metal is supplied to a peripheral portion of the substrate by the metal removal unit such that the metal-containing coating film remains in a region except for the peripheral portion of the surface to be processed of the substrate.

11 Claims, 19 Drawing Sheets

(51) Int. Cl.

| | |
|---|---|
| *B05C 11/10* | (2006.01) |
| *B05D 1/36* | (2006.01) |
| *B05D 3/00* | (2006.01) |
| *C23F 1/00* | (2006.01) |
| *C23F 1/08* | (2006.01) |
| *H01L 21/67* | (2006.01) |
| *H01L 21/677* | (2006.01) |
| *H01L 21/687* | (2006.01) |

(52) U.S. Cl.
CPC ........... *B05C 11/1039* (2013.01); *B05D 1/36* (2013.01); *B05D 3/007* (2013.01); *C23F 1/00* (2013.01); *C23F 1/08* (2013.01); *H01L 21/67051* (2013.01); *H01L 21/6708* (2013.01); *H01L 21/67167* (2013.01); *H01L 21/67173* (2013.01); *H01L 21/67178* (2013.01); *H01L 21/67742* (2013.01); *H01L 21/68707* (2013.01)

(56) References Cited

U.S. PATENT DOCUMENTS

| | | | |
|---|---|---|---|
| 5,993,552 A | 11/1999 | Tsukamoto et al. | 118/319 |
| 6,040,117 A | 3/2000 | Ota et al. | 430/311 |
| 6,302,600 B1 | 10/2001 | Nagase et al. | 396/611 |
| 6,683,007 B1 | 1/2004 | Yamasaki et al. | 438/745 |
| 2001/0037858 A1 | 11/2001 | Taniyama et al. | 156/345 |
| 2002/0112662 A1* | 8/2002 | Yamauchi | H01L 21/67017 118/52 |
| 2003/0079835 A1 | 5/2003 | Kajino et al. | 156/345.11 |
| 2003/0098048 A1 | 5/2003 | Kuroda | 134/32 |
| 2003/0132104 A1 | 7/2003 | Yamashita et al. | 204/252 |
| 2004/0053508 A1 | 3/2004 | Yamasaki et al. | 438/745 |
| 2005/0230348 A1 | 10/2005 | Kido | 216/58 |
| 2005/0257889 A1 | 11/2005 | Yamasaki et al. | 156/345.17 |
| 2006/0068110 A1 | 3/2006 | Fukuda et al. | 427/256 |
| 2007/0184392 A1 | 8/2007 | Kyouda et al. | 430/331 |
| 2007/0215178 A1* | 9/2007 | Yamamoto | H01L 21/6715 134/109 |
| 2008/0015278 A1 | 1/2008 | Malik et al. | 522/150 |
| 2008/0045682 A1 | 2/2008 | Schwab | 526/241 |
| 2008/0142043 A1 | 6/2008 | Yamamoto et al. | 134/18 |
| 2009/0004876 A1 | 1/2009 | Koyata et al. | 438/753 |
| 2009/0149364 A1 | 6/2009 | Beck | 510/165 |
| 2009/0151755 A1 | 6/2009 | Beck | 134/42 |
| 2009/0215658 A1 | 8/2009 | Minsek et al. | 510/175 |
| 2009/0253258 A1 | 10/2009 | Hara et al. | 118/708 |
| 2009/0285991 A1 | 11/2009 | Kitano et al. | 427/346 |
| 2010/0021703 A1 | 1/2010 | Terai et al. | 428/195.1 |
| 2010/0327218 A1 | 12/2010 | Kido | 252/79.1 |
| 2011/0049680 A1* | 3/2011 | Burns | H01L 21/0338 438/689 |
| 2011/0092653 A1 | 4/2011 | Schwab | 525/370 |
| 2011/0130010 A1 | 6/2011 | Yamasaki et al. | 438/745 |
| 2011/0184139 A1 | 7/2011 | Malik et al. | 526/240 |
| 2011/0186086 A1 | 8/2011 | Minsek et al. | 134/26 |
| 2012/0009527 A1 | 1/2012 | Hatakeyama et al. | 430/325 |
| 2012/0100330 A1 | 4/2012 | Soyama et al. | 428/78 |
| 2012/0247670 A1 | 10/2012 | Dobashi et al. | 156/345.31 |
| 2012/0285482 A1 | 11/2012 | Beck | 134/2 |
| 2012/0301612 A1 | 11/2012 | Kitano et al. | 427/240 |
| 2012/0315451 A1 | 12/2012 | Malik et al. | 428/209 |
| 2014/0026923 A1 | 1/2014 | Beck | 134/1.3 |
| 2014/0038423 A1 | 2/2014 | Iwao et al. | 438/758 |
| 2014/0041685 A1 | 2/2014 | Kaneko et al. | 134/4 |
| 2014/0071411 A1 | 3/2014 | Takiguchi et al. | 355/27 |
| 2015/0000697 A1 | 1/2015 | Minsek et al. | 134/3 |
| 2015/0129547 A1 | 5/2015 | Soyama et al. | |
| 2015/0255316 A1 | 9/2015 | Dobashi et al. | |
| 2016/0163534 A1 | 6/2016 | Kaneko et al. | |
| 2016/0172231 A1* | 6/2016 | Lee | H01L 21/31111 438/643 |
| 2016/0202609 A1 | 7/2016 | Takiguchi et al. | 355/27 |
| 2016/0293479 A1* | 10/2016 | Casteel, Jr. | C09K 13/06 |

FOREIGN PATENT DOCUMENTS

| | | |
|---|---|---|
| CN | 1157767 C | 7/2004 |
| CN | 101246315 A | 8/2008 |
| CN | 101366107 A | 2/2009 |
| CN | 101952057 A | 1/2011 |
| CN | 102728580 A | 10/2012 |
| CN | 103567169 A | 2/2014 |
| CN | 104183539 A | 12/2014 |
| JP | 62-199102 U | 12/1987 |
| JP | 05-190442 A | 7/1993 |
| JP | 06-124887 A | 5/1994 |
| JP | 07-234524 A | 9/1995 |
| JP | 08-264418 A | 10/1996 |
| JP | 10-239865 A | 9/1998 |
| JP | 11-016825 A | 1/1999 |
| JP | 2000-199953 A | 7/2000 |
| JP | 2000-228386 A | 8/2000 |
| JP | 2000-286224 A | 10/2000 |
| JP | 2000-338684 A | 12/2000 |
| JP | 2001-110714 A | 4/2001 |
| JP | 2001-196291 A | 7/2001 |
| JP | 2001-319909 A | 11/2001 |
| JP | 2001-319910 A | 11/2001 |
| JP | 2002-134458 A | 5/2002 |
| JP | 2002-359181 A | 12/2002 |
| JP | 2003-178944 A | 6/2003 |
| JP | 2005-303151 A | 10/2005 |
| JP | 2005-353717 A | 12/2005 |
| JP | 2006-93409 A | 4/2006 |
| JP | 2007-208086 A | 8/2007 |
| JP | 2008-153450 A | 7/2008 |
| JP | 2010-034485 A | 2/2010 |
| JP | 2010-118519 A | 5/2010 |
| JP | 2011-040708 A | 2/2011 |
| JP | 2011-530652 A | 12/2011 |
| JP | 2012-032806 A | 2/2012 |
| JP | 2012-174768 A | 9/2012 |
| JP | 2014-045171 A | 3/2014 |
| JP | 2014-75575 A | 4/2014 |
| JP | 2014-195066 A | 10/2014 |
| JP | 2015-028987 A | 2/2015 |
| KR | 10-1998-0018527 A | 6/1998 |
| KR | 10-2009-0118826 A | 11/2009 |
| KR | 10-2014-0018129 A | 2/2014 |
| TW | 353190 B | 2/1999 |
| TW | 201421536 A | 6/2014 |
| WO | WO 2006/056298 A1 | 6/2006 |
| WO | WO 2014/049959 A1 | 4/2014 |

OTHER PUBLICATIONS

Micro-Electro-Mechanical Systems Design and Fabrication, edited by Mohamed Gad-el-Hak, Mechanical Industries Press, pp. 228 (Chinese and English Translation thereof), published in 2006 by Taylor & Francis Group.

International Search Report dated Jul. 19, 2016 in corresponding PCT International Application No. PCT/JP2016/002059.

Written Opinion dated Jul. 19, 2016 in corresponding PCT International Application No. PCT/JP2016/002059.

"Progress in Spin-on Hard Mask Materials for Advanced Lithography"; Munirathna Padmanaban et al.; Journal of Photopolymer Science and Technology; vol. 27, No. 4; pp. 503-509, 2014.

"Metal Oxide Nanoparticle Photoresists for EUV Patterning"; Jing Jiang et al.; Journal of Photopolymer Science of Technology; vol. 27, No. 5; pp. 663-666, 2014.

Office Action dated Nov. 22, 2017 issued in counterpart Taiwanese Patent Application No. 105116503.

Notice of Reasons for Refusal dated Nov. 6, 2018 in counterpart Japanese Patent Application No. 2015-124777.

Notice of Reasons for Refusal dated Jan. 15, 2019 in counterpart Japanese Patent Application No. 2015-124777.

U.S. Office Action dated Nov. 1, 2018 in related U.S. Appl. No. 15/737,805.

Notice of Reasons for Refusal dated Jun. 18, 2019 in related Japanese Patent Application No. 2015-124777.

(56) References Cited

OTHER PUBLICATIONS

Office Action dated Jun. 25, 2019 in counterpart Korean Patent Application No. 10-2017-7033675.
Office Action dated Nov. 27, 2019 in corresponding Korean Patent Application No. 10-2017-7034406.
Office Action dated Mar. 9, 2020 in counterpart Chinese Patent Application No. 201680031649.7.
Decision for Refusal dated Nov. 30, 2020 in counterpart Chinese Patent Application No. 201680031649.7.
Notice of Reasons for Refusal dated Aug. 18, 2020 in counterpart Japanese Patent Application No. 2019-187351.

* cited by examiner

SUBSTRATE PROCESSING APPARATUS, FILM FORMATION UNIT, SUBSTRATE PROCESSING METHOD AND FILM FORMATION METHOD

TECHNICAL FIELD

The present application is a divisional of U.S. patent application Ser. No. 15/579,505, filed Dec. 4, 2017, which a 35 U.S.C. §§ 371 national phase conversion of PCT/JP2016/002059, filed Apr. 15, 2016, which claims priority to Japanese Patent Application Nos. 2015-112811 and 2015-220497, filed Jun. 3, 2015 and filed Nov. 10, 2015, respectively, the contents of all of which are incorporated herein by reference. The PCT International Application was published in the Japanese language.

The present invention relates to a substrate processing apparatus, a film formation unit, a substrate processing method and a film formation method for performing a process of forming a coating film on a substrate.

BACKGROUND ART

In a lithography process in the manufacture of a semiconductor device and the like, a coating liquid such as a resist liquid is supplied onto a substrate, so that a coating film is formed. For example, the substrate is horizontally held and rotated by a spin chuck. In this state, the resist liquid is discharged to a substantially center portion of an upper surface of the substrate from a resist nozzle, whereby a resist film is formed on an entire upper surface of the substrate as a coating film. Here, if the resist film is present in a peripheral portion of the substrate, when a transport mechanism that transports the substrate grips the peripheral portion of the substrate, part of the resist film is stripped and becomes particles. As such, an organic solvent is discharged to the peripheral portion of the substrate from an edge rinse nozzle, whereby the resist film in the peripheral portion of the substrate is dissolved. Thus, the resist film in the peripheral portion of the substrate is removed (see Patent Document 1, for example).

[Patent Document 1] JP 6-124887 A

SUMMARY OF INVENTION

Technical Problem

In recent years, application of a coating film (hereinafter referred to as a metal-containing coating film) containing metal has been studied in order to form finer patterns. However, according to an experiment conducted by the inventors, it is found that, even in the case where the coating film in the peripheral portion of the substrate is removed by discharge of the organic solvent to the peripheral portion of the metal-containing coating film formed on the substrate, a metal component is not removed and remains on the peripheral portion of the substrate. Thus, a substrate processing apparatus and an adjacent exposure device are contaminated by a metal component remaining in the peripheral portion of the substrate.

An object of the present invention is to provide a substrate processing apparatus and a film formation unit capable of forming a metal-containing coating film on a substrate and preventing an occurrence of metal contamination, and a substrate processing method and a film formation method by which the metal-containing coating film can be formed on the substrate and the occurrence of the metal contamination can be prevented.

Solution to Problem (1) A substrate processing apparatus according to one aspect of the present invention includes a film formation unit that forms a metal-containing coating film on a surface to be processed by supplying a coating liquid containing metal as a metal-containing coating liquid to the surface to be processed of a substrate, a peripheral portion removal unit that, after formation of the metal-containing coating film by the film formation unit, supplies a first removal liquid for dissolving the metal to a peripheral portion of the substrate such that the metal-containing coating film remains in a region except for the peripheral portion of the surface to be processed of the substrate, and a transport mechanism that, after the formation of the metal-containing coating film by the film formation unit, transports the substrate to the peripheral portion removal unit.

In this substrate processing apparatus, the coating liquid containing metal is supplied as the metal-containing coating liquid to the surface to be processed of the substrate by the film formation unit. Thus, the metal-containing coating film is formed on the surface to be processed of the substrate. The substrate on which the metal-containing coating film has been formed is transported to the peripheral portion removal unit by the transport mechanism. Further, the first removal liquid for dissolving metal is supplied to the peripheral portion of the substrate by the peripheral portion removal unit. Thus, the metal in the metal-containing coating film in the peripheral portion of the substrate is dissolved, and the metal-containing coating film remains in a region except for the peripheral portion of the surface to be processed of the substrate.

In this configuration, the metal-containing coating film is formed on the surface to be processed of the substrate except for the peripheral portion, and metal is prevented from remaining in the peripheral portion of the substrate. Therefore, even in the case where the transport mechanism holds the peripheral portion of the substrate, the metal does not adhere to a transport mechanism. Thus, the metal-containing coating film can be formed on the substrate, and an occurrence of metal contamination can be prevented.

(2) The film formation unit may include a first rotation holder that holds and rotates the substrate in a horizontal attitude, and a coating liquid nozzle that discharges the metal-containing coating liquid to the surface to be processed of the substrate rotated by the first rotation holder, and the peripheral portion removal unit may include a second rotation holder that holds and rotates the substrate in a horizontal attitude, and a first removal liquid nozzle that discharges the first removal liquid to the peripheral portion of the surface to be processed of the substrate rotated by the second rotation holder. In this case, the metal-containing coating film can be formed on the surface to be processed of the substrate except for the peripheral portion with a simple configuration, and the metal in the peripheral portion of the substrate can be removed.

(3) At least one of the film formation unit and the peripheral portion removal unit may further include a second removal liquid nozzle that discharges a second removal liquid for dissolving the coating liquid to the peripheral portion of the surface to be processed of the rotating substrate.

In this case, the coating liquid in the peripheral portion of the substrate is removed by at least one of the film formation unit and the peripheral portion removal unit. Thus, the metal-containing coating film in the peripheral portion of the substrate is reliably removed. Thus, the substrate processing apparatus can be prevented from being contaminated by particles.

(4) The peripheral portion removal unit may further include a third removal liquid nozzle that discharges the first removal liquid to a back surface that is opposite to the surface to be processed of the rotating substrate. In this configuration, even in the case where the metal-containing coating liquid flows to the back surface of the substrate, metal in the metal-containing coating liquid adhering to the back surface of the substrate is removed by the peripheral portion removal unit. Thus, the substrate processing apparatus can be sufficiently prevented from being contaminated by metal.

(5) The substrate processing apparatus may further include a thermal processing section that, after the formation of the metal-containing coating film by the film formation unit and before discharge of the first removal liquid by the peripheral portion removal unit, cures the metal-containing coating film by thermal processing, wherein the peripheral portion removal unit may further include a gas discharger that, when the first removal liquid is being discharged to the peripheral portion of the surface to be processed by the first removal liquid nozzle, discharges gas to a position closer to a center of the substrate than a position to which the first removal liquid is being discharged.

In this case, gas is discharged outward from the center of the substrate by the gas discharger. Thus, the first removal liquid is prevented from being splashed to the surface to be processed of the substrate except for the peripheral portion. Further, because the metal-containing coating film is cured by the thermal processing section, even when the gas is discharged to the substrate from the gas discharger, the film thickness of the metal-containing coating film is not changed. As a result, the metal-containing coating film can be formed on the surface to be processed of the substrate to have a uniform thickness.

(6) The peripheral portion removal unit may further include a development nozzle that discharges a development liquid to the surface to be processed of the substrate rotated by the second rotation holder. In this case, the substrate can be developed in the peripheral portion removal unit.

(7) The development liquid and the first removal liquid may be a same processing liquid. In this case, the metal in the metal-containing coating film in the peripheral portion of the substrate is dissolved by the development liquid, and the metal-containing coating film remains in a region except for the peripheral portion of the surface to be processed of the substrate.

In this configuration, the metal-containing coating film is formed on the surface to be processed of the substrate except for the peripheral portion, and the metal is prevented from remaining in the peripheral portion of the substrate. Therefore, even in the case where a transport mechanism holds the peripheral portion of the substrate, the metal does not adhere to the transport mechanism. Thus, the metal-containing coating film can be formed on the substrate, and an occurrence of metal contamination can be prevented.

Further, the removal of metal from the peripheral portion of the substrate and the development of the substrate are performed by the same processing liquid, so that it is not necessary to collect the development liquid separately from another liquid. Thus, cost of discarding the development liquid can be reduced.

(8) The development nozzle and the first removal liquid nozzle may be constituted by a common nozzle. In this case, it is not necessary to separately provide the development nozzle and the first removal liquid nozzle in the peripheral portion removal unit. Thus, the size of the substrate processing apparatus can be inhibited from being increased.

(9) The film formation unit may be arranged to be adjacent to the peripheral portion removal unit. In this case, the metal in the metal-containing coating film in the peripheral portion of the substrate is immediately removed by the peripheral portion removal unit adjacent to the film formation unit. Thus, the substrate processing apparatus can be sufficiently prevented from being contaminated by metal.

(10) The transport mechanism may include a pre-removal substrate holder that holds and transports the substrate having the peripheral portion from which the metal has not been removed by the peripheral portion removal unit, and a post-removal substrate holder that holds and transports the substrate having the peripheral portion from which the metal has been removed by the peripheral portion removal unit.

In this case, the substrate having the peripheral portion from which the metal has not been removed, and the substrate having the peripheral portion from which the metal has been removed are held by the different holders of the transport mechanism. Thus, adherence of metal to the substrate having the peripheral portion from which the metal has been removed via the holder of the transport mechanism is prevented.

(11) A film formation unit according to another aspect of the present invention includes a third rotation holder that holds and rotates a substrate in a horizontal attitude, a coating liquid nozzle that discharges a coating liquid containing metal as a metal-containing coating liquid to a surface to be processed of the substrate rotated by the third rotation holder, and a peripheral portion removal liquid supply unit that supplies a third removal liquid for dissolving the metal-containing coating liquid to a peripheral portion of the surface to be processed of the substrate rotated by the third rotation holder such that the metal-containing coating film remains in a region except for the peripheral portion of the surface to be processed of the substrate.

In this film formation unit, the substrate is held and rotated in a horizontal attitude by the third rotation holder. The coating liquid containing metal is discharged as the metal-containing coating liquid to the surface to be processed of the rotating substrate from the coating liquid nozzle. The third removal liquid for dissolving the metal-containing coating liquid is supplied to the peripheral portion of the surface to be processed of the rotating substrate by the peripheral portion removal liquid supply unit. Thus, the metal-containing coating film remains in a region except for the peripheral portion of the surface to be processed of the substrate.

In this configuration, the metal-containing coating film is formed on the surface to be processed of the substrate except for the peripheral portion, and the metal is prevented from remaining in the peripheral portion of the substrate. Thus, the metal-containing coating film can be formed on the substrate, and an occurrence of metal contamination can be prevented.

(12) The third removal liquid may include a fourth removal liquid for dissolving the metal and a fifth removal liquid for dissolving the coating liquid, and the peripheral portion removal liquid supply unit may include one or a plurality of removal liquid nozzles for supplying the fourth and fifth removal liquids to the peripheral portion of the surface to be processed of the substrate.

In this case, the metal in the metal-containing coating liquid is removed by the fourth removal liquid, and the coating liquid in the metal-containing coating liquid is removed by the fifth removal liquid. Thus, the metal-containing coating film in the peripheral portion of the substrate is reliably removed. Thus, the substrate processing apparatus can be prevented from being contaminated by particles.

(13) The film formation unit may further include a removal liquid collection unit provided to separately collect the used fourth removal liquid that has been discharged to the substrate separately and the used fifth removal liquid that has been discharged to the substrate.

In this case, it is not necessary for the user to perform an operation of separating the used fourth removal liquid from the used fifth removal liquid. Thus, cost of discarding the third removal liquid can be reduced.

(14) The plurality of removal liquid nozzles may discharge the fourth and fifth removal liquids in first and second periods that are different from each other, and the removal liquid collection unit may include a first collector that collects the used fourth removal liquid, a second collector that collects the used fifth removal liquid, and a switching path that switches to lead the used fourth removal liquid, which has been discharged to the substrate in the first period, to the first collector, and lead the used fifth removal liquid, which has been discharged to the substrate in the second period, to the second collector.

In this case, the used fourth removal liquid and the used fifth removal liquid can be separated with a simple configuration based on periods during which the fourth and fifth removal liquids are discharged.

(15) The switching path may include a cup for receiving the fourth and fifth removal liquids splashed from the substrate, a first collection pipe connected between the cup and the first collector, a second collection pipe connected between the cup and the second collector, a first collection valve inserted into the first collection pipe, a second collection valve inserted into the second collection pipe, and a controller that controls the first and second collection valves, the controller allowing the first collection valve to be opened and allowing the second collection valve to be closed in order for the fourth removal liquid to be collected in the first collector, and the controller allowing the second collection valve to be opened and allowing the first collection valve to be closed in order for the fifth removal liquid to be collected in the second collector.

In this case, the used fourth removal liquid can be collected in the first collector, and the used fifth removal liquid can be collected in the second collector, with simple control.

(16) Specific gravity of the fourth removal liquid may be larger than specific gravity of the fifth removal liquid, and the removal liquid collection unit may include a storage that stores the used fourth and fifth removal liquids, and a removal liquid separating mechanism that separates the fourth and fifth removal liquids stored in the storage based on specific gravity.

In this case, the used fourth removal and the used fifth removal liquid can be separated with a simple configuration based on specific gravity of the fourth and fifth removal liquids.

(17) The removal liquid separating mechanism may include a cup that receives the fourth and fifth removal liquids splashed from the substrate, a collection pipe connected between the cup and the storage, a first discharge pipe provided to discharge the used fourth removal liquid from the storage, a second discharge pipe provided to discharge the used fifth removal liquid from the storage, a first discharge valve inserted into the first discharge pipe, a boundary surface detector that detects a boundary surface between the fourth removal liquid and the fifth removal liquid stored in the storage, and a controller that acquires the boundary surface detected by the boundary surface detector, controls the first discharge valve such that, in the case where the acquired detection surface is equal to or lower than a predetermined lower limit position, the first discharge valve is closed, and controls the first discharge valve such that, in the case where the acquired detection surface is higher than the lower limit position, the first discharge valve is opened, and the first discharge pipe may be connected to the storage lower than the lower limit position, and the second discharge pipe may be connected to the storage at a position higher than the lower limit position.

In this case, the used fourth removal liquid is collected from the storage through the first discharge pipe, and the used fifth removal liquid can be collected from the storage through the second discharge pipe, with simple control.

(18) The removal liquid separating mechanism may further include a second discharge valve inserted into the second discharge pipe, and the controller, in the case where the acquired detection surface is equal to or lower than a predetermined upper limit position, which is higher than the lower limit position, opens the second discharge valve, and in the case where the acquired detection surface is higher than the upper limit position, closes the second discharge valve.

In this case, the used fourth removal liquid can be prevented from being collected from the storage through the second discharge pipe with a simple configuration.

(19) The third removal liquid may dissolve the metal and the coating liquid. In this case, the metal and the coating liquid in the metal-containing coating liquid are simultaneously removed by the third removal liquid. Thus, the metal and the coating liquid in the peripheral portion of the substrate can be efficiently removed. Further, it is not necessary to separately collect the third removal liquid. As a result, cost of processing the substrate can be reduced.

(20) The film formation unit may further include a back surface removal liquid supply unit that supplies a third removal liquid for dissolving the metal-containing coating liquid to a back surface, which is opposite to the surface to be processed of the substrate, rotated by the third rotation holder.

In this configuration, even in the case where the metal-containing coating liquid flows to the back surface of the substrate, the metal-containing coating liquid adhering to the back surface of the substrate is removed by the back surface removal liquid supply unit. Thus, the film formation unit can be sufficiently prevented from being contaminated by metal.

(21) A substrate processing method according to yet another aspect of the present invention includes the steps of forming a metal-containing coating film on a surface to be processed by supplying a coating liquid containing metal as a metal-containing coating liquid to the surface to be processed of a substrate by a film formation unit, transporting the substrate on which the metal-containing coating film has been formed to a peripheral portion removal unit by a transport mechanism, and supplying a first removal liquid for dissolving the metal to a peripheral portion of the substrate by the peripheral portion removal unit such that the metal-containing coating film remains in a region except for the peripheral portion of the surface to be processed of the substrate.

In this substrate processing method, the coating liquid containing metal is supplied as the metal-containing coating liquid to the surface to be processed of the substrate by the film formation unit. Thus, the metal-containing coating film is formed on the surface to be processed of the substrate. The substrate on which the metal-containing coating film has been formed is transported to the peripheral portion removal unit by the transport mechanism. Further, the first removal liquid for dissolving metal is supplied to peripheral portion of the substrate by the peripheral portion removal unit. Thus, the metal in the metal-containing coating film in the peripheral portion of the substrate is dissolved, and the metal-containing coating film remains in a region except for the peripheral portion of the surface to be processed of the substrate.

In this method, the metal-containing coating film is formed on the surface to be processed of the substrate except for the peripheral portion, and metal is prevented from remaining in the peripheral portion of the substrate. Therefore, even in the case where the peripheral portion of the substrate is held by the transport mechanism, metal does not adhere to the transport mechanism. Thus, the metal-containing coating film can be formed on the substrate, and an occurrence of metal contamination can be prevented.

(22) A film formation method according to yet another aspect of the present invention includes the steps of holding and rotating a substrate in a horizontal attitude by a third rotation holder, discharging a coating liquid containing metal as a metal-containing coating liquid by a coating liquid nozzle to a surface to be processed of the substrate rotated by the third rotation holder, and supplying a third removal liquid for dissolving the metal-containing coating liquid to a peripheral portion of the surface to be processed of the substrate, rotated by the third rotation holder, by a peripheral portion removal liquid supply unit such that the metal-containing coating film remains in a region except for the peripheral portion of the surface to be processed of the substrate.

In this film formation method, the substrate is held and rotated in a horizontal attitude by the third rotation holder. The coating liquid containing metal is discharged as the metal-containing coating liquid to the surface to be processed of the rotating substrate by the coating liquid nozzle. The third removal liquid for dissolving the metal-containing coating liquid is supplied to the peripheral portion of the surface to be processed of the rotating substrate by the peripheral portion removal liquid supply unit. Thus, the metal-containing coating film remains in a region except for the peripheral portion of the surface to be processed of the substrate.

In this method, the metal-containing coating film is formed on the surface to be processed of the substrate except for the peripheral portion, and metal is prevented from remaining in the peripheral portion of the substrate. Thus, the metal-containing coating film can be formed on the substrate, and an occurrence of metal contamination can be prevented.

Advantageous Effects of Invention

The present invention enables the metal-containing coating film to be formed on the substrate, and an occurrence of metal contamination to be prevented.

DESCRIPTION OF EMBODIMENTS

A substrate processing apparatus and a substrate processing method according to one embodiment of the present invention will be described below with reference to drawings. In the following description, a substrate refers to a semiconductor substrate, a substrate for a liquid crystal display device, a substrate for a plasma display, a substrate for an optical disc, a substrate for a magnetic disc, a substrate for a magneto-optical disc, a substrate for a photomask or the like. Further, as for the substrate used in the present embodiment, at least part of the substrate has a circular outer periphery. The outer periphery except for a notch for positioning is circular, for example.

[1] First Embodiment

(1) Substrate Processing Apparatus

Figure 1:
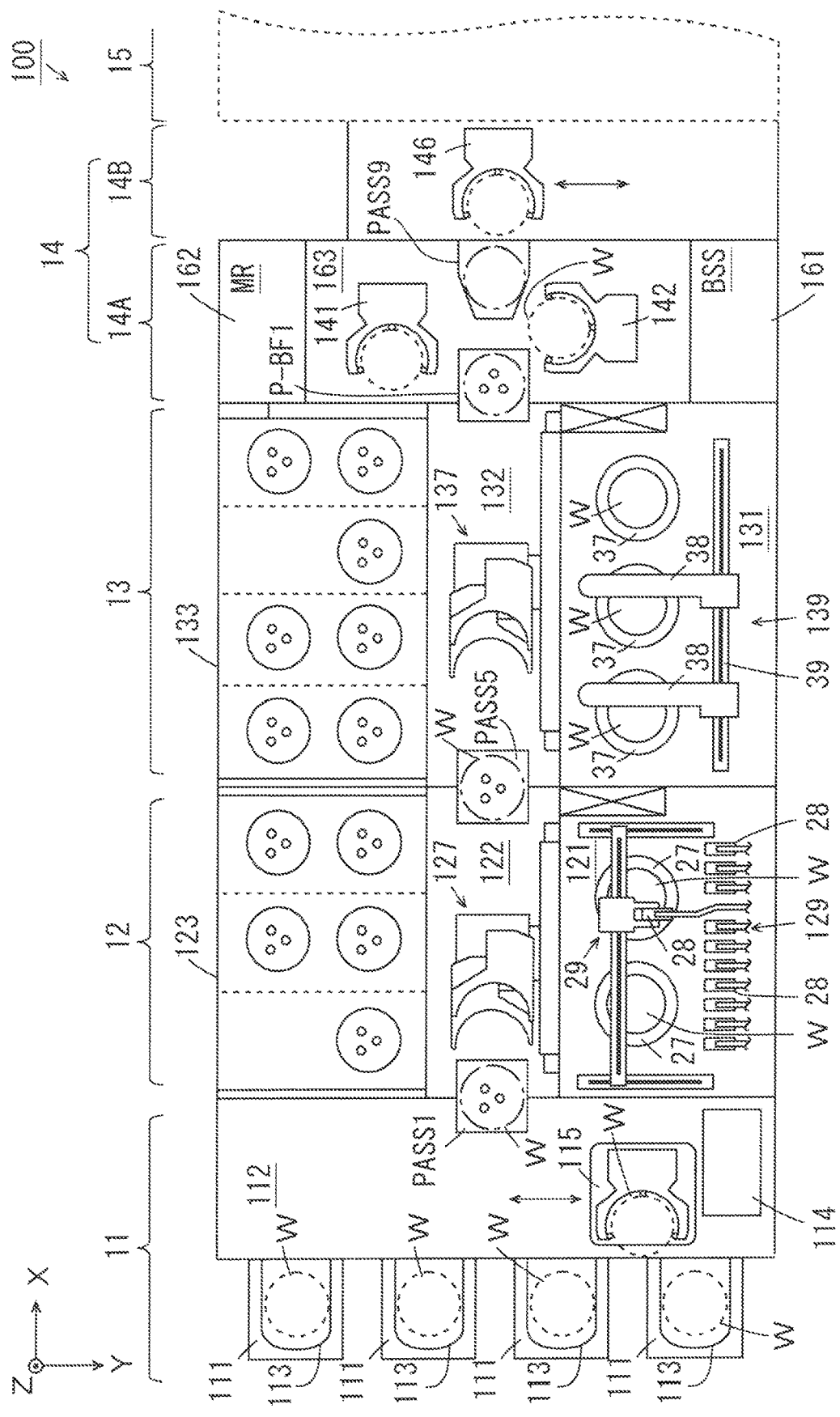
FIG. 1 is a schematic plan view of a substrate processing apparatus according to a first embodiment of the present invention.

FIG. 1 is a schematic plan view of the substrate processing apparatus according to the first embodiment of the present invention. FIG. 1 and the subsequent drawings are accompanied by arrows that indicate X, Y and Z directions orthogonal to one another for the clarity of a positional relationship. The X and Y directions are orthogonal to each other within a horizontal plane, and the Z direction corresponds to a vertical direction.

As shown in FIG. 1, the substrate processing apparatus 100 includes an indexer block 11, a first processing block 12, a second processing block 13, a cleaning drying processing block 14A and a carry-in carry-out block 14B. An interface block 14 is constituted by the cleaning drying processing block 14A and the carry-in carry-out block 14B. An exposure device 15 is arranged to be adjacent to the carry-in carry-out block 14B.

As shown in FIG. 1, the indexer block 11 includes a plurality of carrier platforms 111 and a transport section 112. In each carrier platform 111, a carrier 113 for storing a plurality of substrates W in multiple stages is placed. In the transport section 112, a main controller 114 and a transport mechanism 115 are provided. The main controller 114 controls various constituent elements of the substrate processing apparatus 100. The transport mechanism 115 holds and transports the substrate W.

The first processing block 12 includes a coating processing section 121, a transport section 122 and a thermal processing section 123. The coating processing section 121 and the thermal processing section 123 are provided to be opposite to each other with the transport section 122 interposed therebetween. Substrate platforms PASS1 to PASS4 (see FIG. 7) on which the substrates W are placed are provided between the transport section 122 and the indexer block 11. Transport mechanisms 127, 128 (see FIG. 7) for transporting the substrates W are provided in the transport section 122.

The second processing block 13 includes a development processing section 131, a transport section 132 and a thermal processing section 133. The development processing section 131 and the thermal processing section 133 are provided to be opposite to each other with the transport section 132 interposed therebetween. Substrate platforms PASS5 to PASS8 (see FIG. 7) on which the substrates W are placed are provided between the transport section 132 and the transport section 122. Transport mechanisms 137, 138 (see FIG. 7) for transporting the substrates W are provided in the transport section 132.

The cleaning drying processing block 14A includes cleaning drying processing sections 161, 162 and a transport section 163. The cleaning drying processing sections 161, 162 are provided to be opposite to each other with the transport section 163 interposed therebetween. Transport mechanisms 141, 142 are provided in the transport section 163. Placement buffer units P-BF1, P-BF2 (see FIG. 7) are provided between the transport section 163 and the transport section 132. The placement buffer units P-BF1, P-BF2 are configured to be able to store the plurality of substrates W.

Further, a substrate platform PASS9, below-mentioned edge exposure units EEW (see FIG. 7) and below-mentioned placement cooling units P-CP (see FIG. 7) are provided to be adjacent to the carry-in carry-out block 14B between the transport mechanisms 141, 142. The placement cooling units P-CP include a function of cooling the substrates W (cooling plates, for example). In the placement cooling units P-CP, the substrates W are cooled to a temperature suitable for the exposure processing. A transport mechanism 146 is provided in the carry-in carry-out block 14B. The transport mechanism 146 carries in the substrate W to and carries out the substrate W from the exposure device 15.

Figure 2:
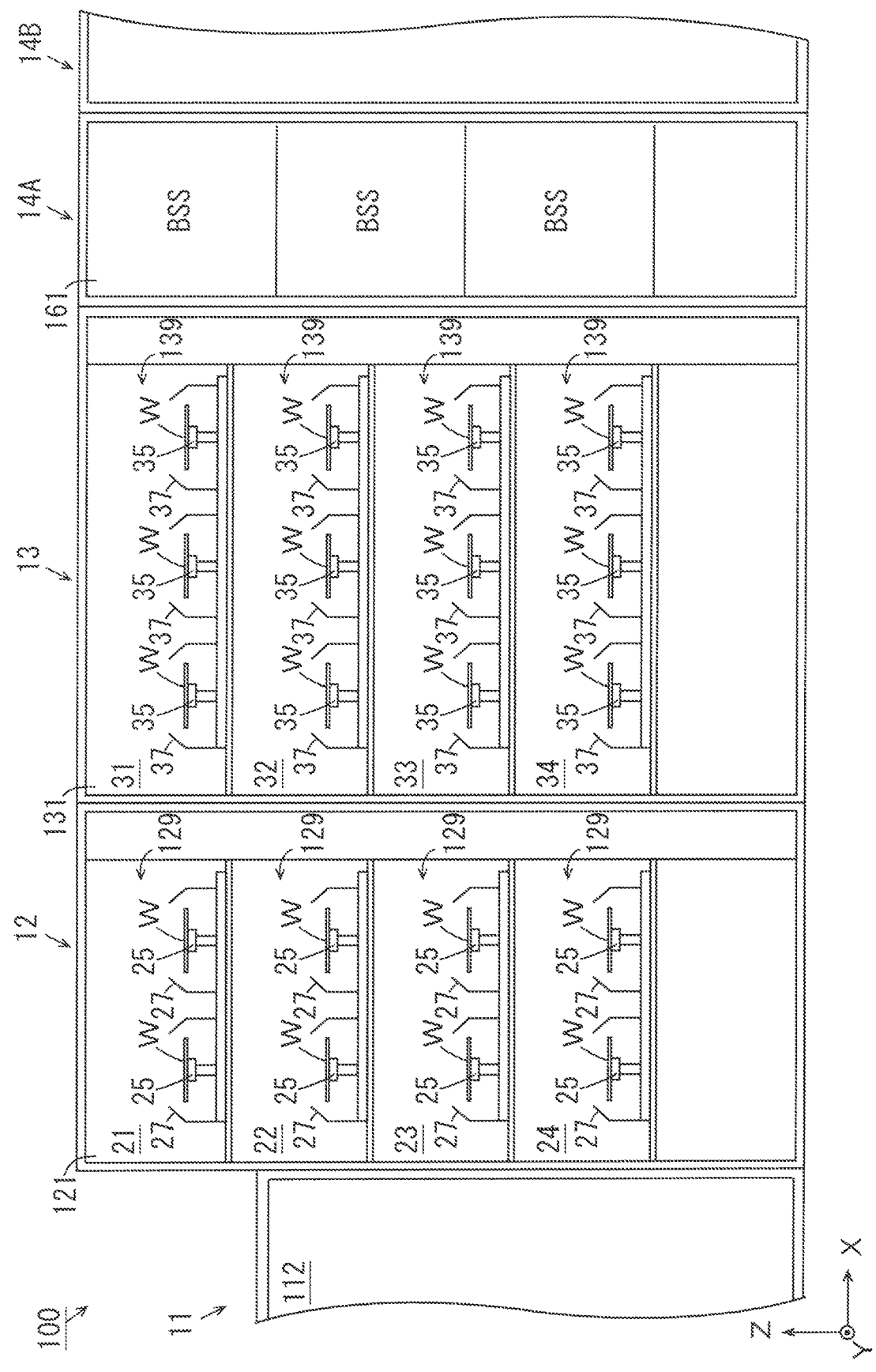
FIG. 2 is a schematic side view showing inner configurations of a coating processing section, a development processing section and a cleaning drying processing section of FIG. 1.

(2) Coating Processing Section, Development Processing Section and Cleaning Drying Processing Section FIG. 2 is a schematic side view showing inner configurations of the coating processing section 121, the development processing section 131 and the cleaning drying processing section 161 of FIG. 1. As shown in FIG. 2, the coating processing section 121 has coating processing chambers 21, 22, 23, 24 provided in a stack. Each of the coating processing chambers 21 to 24 is provided with a coating processing unit 129. The development processing section 131 has development processing chambers 31 to 34 provided in a stack. Each of the development processing chambers 31 to 34 is provided with a development processing unit 139.

Figure 3:
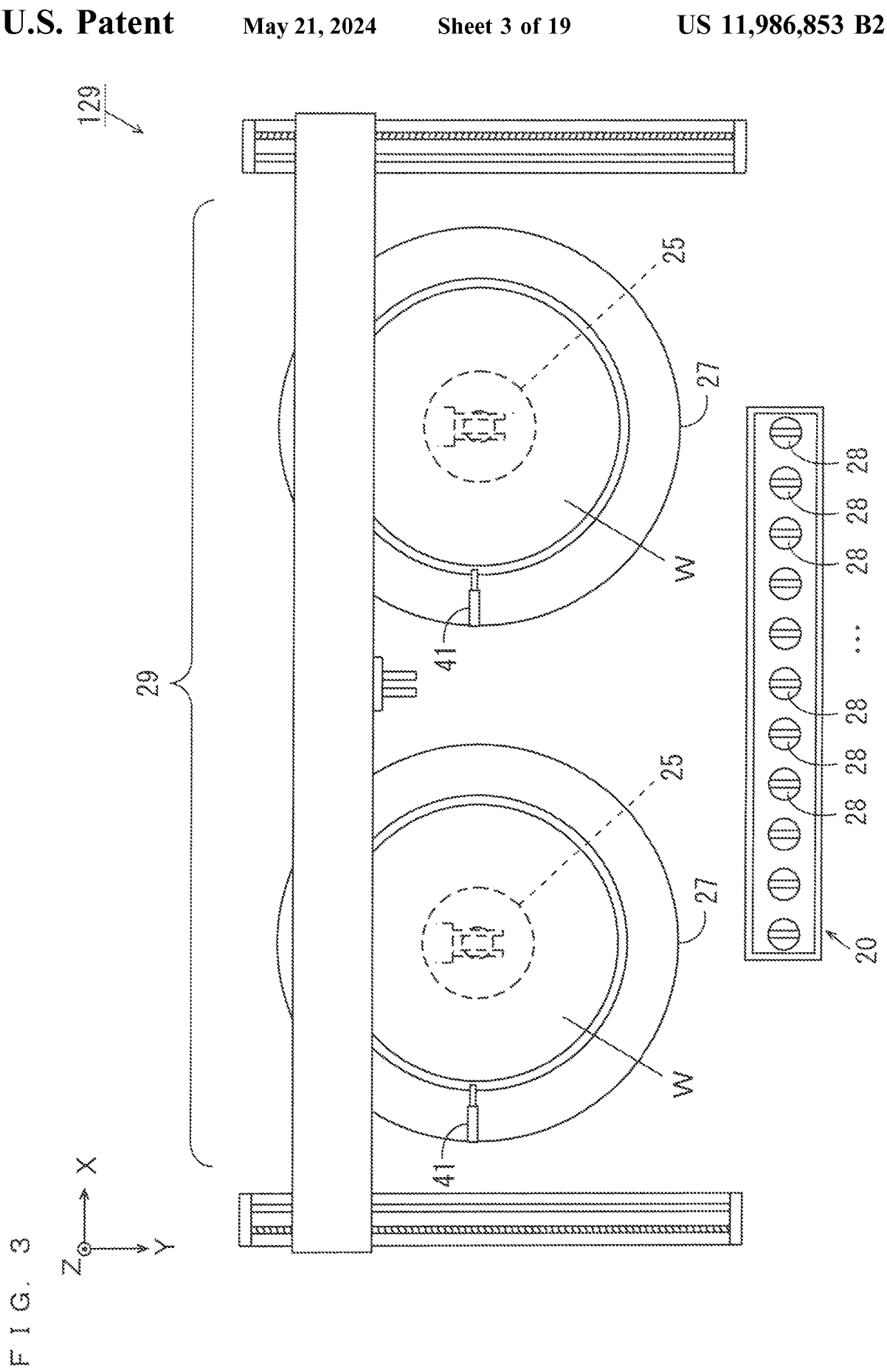
FIG. 3 is a schematic plan view showing a configuration of a coating processing unit.

FIG. 3 is a schematic plan view showing a configuration of the coating processing unit 129. As shown in FIG. 3, each coating processing unit 129 includes a waiting section 20, a plurality of spin chucks 25, a plurality of cups 27, a plurality of coating liquid nozzles 28, a nozzle transport mechanism 29 and a plurality of edge rinse nozzles 41. In the present embodiment, two spin chucks 25, two cups 27, two edge rinse nozzles 41 are provided in each coating processing unit 129.

Each spin chuck 25 is driven to be rotated by a driving device (not shown) (an electrical motor, for example) while holding the substrate W. Each cup 27 is provided to surround the spin chuck 25. During the wait, each coating liquid nozzle 28 is inserted into the waiting section 20. Various types of coating liquids are supplied to each coating liquid nozzle 28 from a coating liquid storage (not shown) through a coating liquid pipe. Any one of the plurality of coating liquid nozzles 28 is moved to a position above the substrate W by the nozzle transport mechanism 29. The coating liquid is discharged from the coating liquid nozzle 28 while the spin chuck 25 is rotated. Thus, the coating liquid is applied to the rotating substrate W.

In the present embodiment, a coating liquid (an anti-reflection liquid) for an anti-reflection film is discharged from the coating liquid nozzle 28 of each of the coating processing chambers 22, 24 of FIG. 2. A coating liquid (a resist liquid) for a resist film is discharged from the coating liquid nozzle 28 of each of the coating processing chambers 21, 23.

A metallic component such as metallic molecules or metallic oxide for achieving further sensitivity is contained in the anti-reflection liquid and the resist liquid as a composition. In the present example, Sn (tin), $HfO_2$ (hafnium oxide) or $ZrO_2$ (zirconium dioxide), for example, is contained in the anti-reflection liquid and the resist liquid as a metallic component. Hereinafter, the coating liquid such as the anti-reflection liquid containing a metallic component or the resist liquid containing a metallic component is collectively termed as a metal-containing coating liquid. Further, a film formed of the metal-containing coating liquid is referred to as a metal-containing coating film.

The edge rinse nozzle 41 is arranged to be directed to a peripheral portion of a surface to be processed of the substrate W held by the spin chuck 25. Here, the surface to be processed refers to a surface of the substrate W on which each type of a trace such as a circuit trace is formed. The peripheral portion of the substrate W refers to a region, having a constant width and extending along an outer periphery of the substrate W, of the surface to be processed of the substrate W.

A removal liquid for removing the metal-containing coating liquid from the peripheral portion of the substrate W can be discharged from the edge rinse nozzle 41. In addition to an organic solvent including a thinner, butyl acetate, PGMEA (propyleneglycol monomethyl ether acetate) and PGME (propyleneglycol monomethyl ether), for example, an aqueous solution including TMAH (Tetra Methyl Ammonium Hydroxide), an aqueous solution including ammonia and hydrogen peroxide solution or the like may be discharged as the removal liquid. Hereinafter, the removal liquid discharged from the edge rinse nozzle 41 is referred to as a film removal liquid.

With the substrate W rotated by the spin chuck 25, the film removal liquid is discharged to the peripheral portion of the substrate W from the edge rinse nozzle 41. In this case, the coating liquid applied to the peripheral portion of the substrate W is dissolved. Thus, the coating film in the peripheral portion of the substrate W is removed. Thus, even when a transport arm grips the peripheral portion of the substrate W, generation of particles can be avoided, and the substrate processing apparatus 100 can be prevented from being contaminated by particles.

As shown in FIG. 2, the development processing unit 139 includes a plurality of spin chucks 35 and a plurality of cups 37 similarly to the coating processing unit 129. Further, as shown in FIG. 1, the development processing unit 139 includes two slit nozzles 38 for discharging a development liquid and a movement mechanism 39 for moving these slit nozzles 38 in an X direction.

An alkaline aqueous solution can be used as a development liquid for positive-tone development processing in which a region exposed by the exposure device 15 is soluble in the development liquid. The alkaline aqueous solution includes TMAH or KOH (potassium hydroxide), for example. On the other hand, an organic solvent can be used as a development liquid for negative-tone development processing in which an unexposed region, which has not been exposed by the exposure device 15, is soluble in the development liquid. The organic solvent includes butyl acetate, for example.

In the development processing unit 139, a spin chuck 35 is rotated by a driving device (not shown). Thus, the substrate W is rotated. In this state, the development liquid is supplied to each substrate W while the slit nozzle 38 is moved. Thus, development processing for the substrate W is performed.

A plurality (three in the present example) of cleaning drying processing units BSS are provided in the cleaning drying processing section 161. In each cleaning drying processing unit BSS, the peripheral portion and a back surface of the substrate W on which the exposure processing has not been performed are cleaned with use of the above-mentioned organic solvent, the above-mentioned aqueous solution or pure water and dried. Here, the back surface refers to a surface opposite to the surface to be processed of the substrate W.

(3) Thermal Processing Sections

Figure 4:
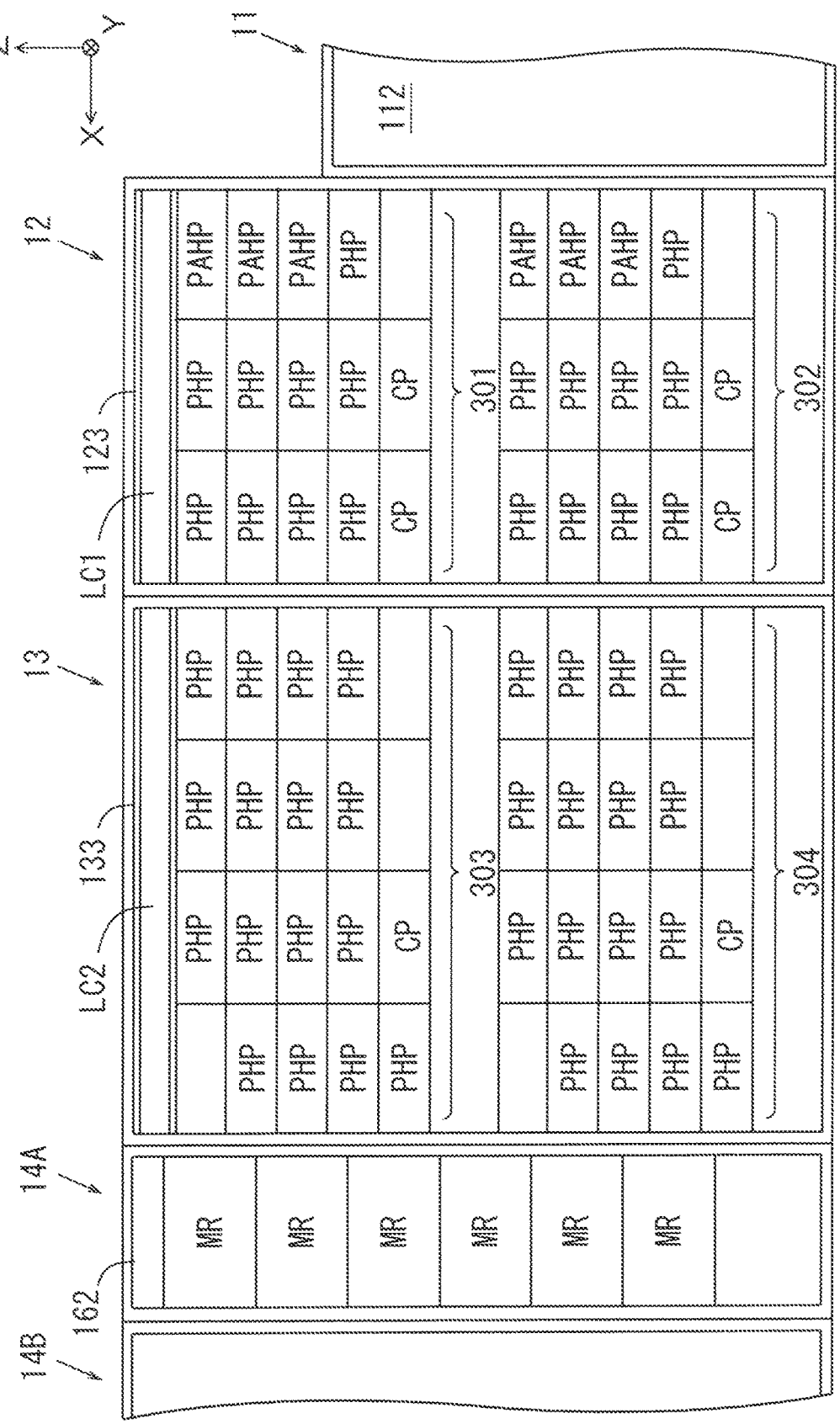
FIG. 4 is a schematic side view showing inner configurations of thermal processing sections and a cleaning drying processing section of FIG. 1.

FIG. 4 is a schematic side view showing inner configurations of the thermal processing sections 123, 133 and the cleaning drying processing section 162 of FIG. 1. As shown in FIG. 4, the thermal processing section 123 has an upper thermal processing section 301 provided above and a lower thermal processing section 302 provided below. In the upper thermal processing section 301 and the lower thermal processing section 302, a plurality of thermal processing units PHP, a plurality of adhesion reinforcement processing units PAHP and a plurality of cooling units CP are provided.

A local controller LC1 is provided at the top of the thermal processing section 123. The local controller LC1 controls operations of the coating processing section 121, the transport section 122 and the thermal processing section 123 based on instructions from the main controller 114 of FIG. 1.

In each thermal processing unit PHP, heating processing and cooling processing for the substrate W are performed. In each adhesion reinforcement processing unit PAHP, adhesion reinforcement processing for improving adhesion between the substrate W and an anti-reflection film is performed. Specifically, in the adhesion reinforcement processing unit PAHP, an adhesion reinforcement agent such as HMDS (hexamethyldisilazane) is applied to the substrate W, and the heating processing is performed on the substrate W. In the cooling unit CP, the cooling processing for the substrate W is performed.

The thermal processing section 133 has an upper thermal processing section 303 provided above and a lower thermal processing section 304 provided below. A cooling unit CP and a plurality of thermal processing units PHP are provided in each of the upper thermal processing section 303 and the lower thermal processing section 304.

A local controller LC2 is provided at the top of the thermal processing section 133. The local controller LC2 controls operations of the development processing section 131, the transport section 132 and the thermal processing section 133 based on instructions from the main controller 114 of FIG. 1.

(4) Metal Removal Unit

As described above, with the substrate W rotated by the spin chuck 25 of FIG. 3, the film removal liquid is discharged to the peripheral portion of the substrate W from the edge rinse nozzle 41. Thus, the metal-containing coating liquid applied to the peripheral portion of the substrate W is dissolved. Thus, the metal-containing coating film in the peripheral portion of the substrate W is removed. However, a metal component contained in the metal-containing coating liquid remains in the peripheral portion of the substrate W. In the case where the metal-containing coating liquid flows to the back surface of the substrate W, a metal component contained in the metal-containing coating liquid remains on the back surface of the substrate W.

When the substrate W is transported in the substrate processing apparatus 100 with a metal component adhering to the peripheral portion or the back surface of the substrate W, inside of the substrate processing apparatus 100 and inside of the exposure device 15 are contaminated by the metal component. Thus, a plurality (six in the present example) of metal removal units MR, for removing a metal component adhering to the peripheral portion and the back surface of the substrate W on which the exposure processing has not been performed, are provided in the cleaning drying processing section 162.

In the metal removal unit MR, an alkaline removal liquid or an acid removal liquid is used as a removal liquid. The alkaline removal liquid is an aqueous solution including ammonia and hydrogen peroxide, for example. The alkaline removal liquid may be TMAH, for example. The acid removal liquid is an aqueous solution including diluted hydrofluoric acid, for example. The acid removal liquid may be an aqueous solution including sulfuric acid and hydrogen peroxide, or an aqueous solution including acetic acid or a chelating agent, for example. The chelating agent includes one type or a plurality of types selected from a group including an organic acid, an organic acid salt, an amino acid, an amino acid derivative, inorganic alkali, an inorganic alkali salt, an alkilamine, an alkilamine derivative, an alkanolamine and an alkanolamine derivative. Hereinafter, the alkaline removal liquid or the acid removal liquid is referred to as a metal removal liquid. The metal removal liquid can dissolve a metal component contained in the anti-reflection liquid or the resist liquid.

In the present example, three metal removal units MR use a metal removal liquid different from a metal removal liquid used in remaining three metal removal units MR. In this case, according to a type of a metal component contained in the metal-containing coating liquid, the metal component adhering to the peripheral portion and the back surface of the substrate W can be removed by a suitable metal removal unit MR.

Figure 5:
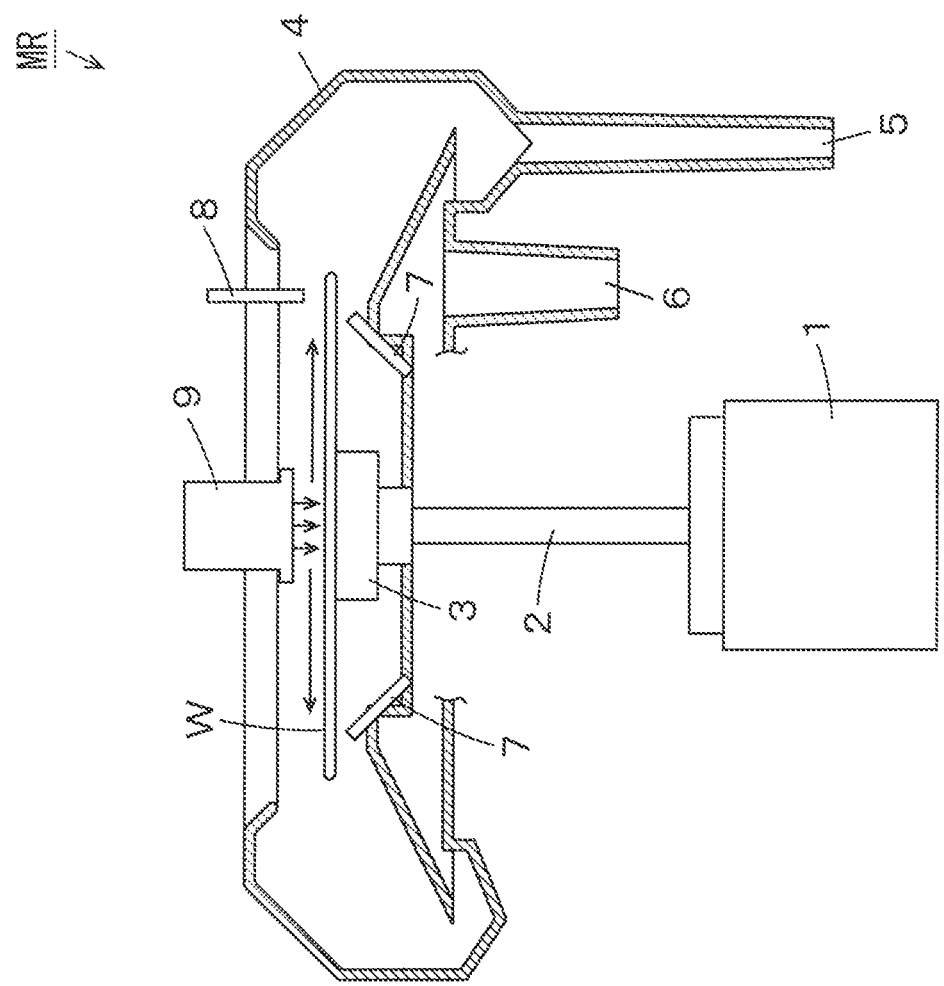
FIG. 5 is a diagram showing an example of a first configuration of a metal removal unit.

FIG. 5 is a diagram showing an example of a first configuration of a metal removal unit MR. As shown in FIG. 5, a motor 1, a spin chuck 3, a cup 4, two back surface cleaning nozzles 7, a peripheral portion cleaning nozzle 8 and a gas supplier 9 are provided in the metal removal unit MR. The spin chuck 3 is attached to an upper end of a rotation shaft 2 of the motor 1 to be rotatable about a vertical axis. The cup 4 is arranged to surround the substrate W held by the spin chuck 3. A liquid discharger 5 and a gas discharger 6 are formed in lower portions of the cup 4.

The two back surface cleaning nozzles 7 are arranged to be directed to the back surface of the substrate W held by the spin chuck 3. The metal removal liquid is discharged to the back surface of the substrate W from the back surface cleaning nozzles 7. The peripheral portion cleaning nozzle 8 is arranged to be directed to the peripheral portion of the substrate W held by the spin chuck 3. The metal removal liquid is discharged to the peripheral portion of the substrate W from the peripheral portion cleaning nozzle 8.

The gas supplier 9 is arranged above a substantially center portion of the substrate W held by the spin chuck 3. An inert gas, for example, a nitrogen gas, is ejected to the substantially center portion of the surface to be processed of the substrate W from the gas supplier 9. In this case, the gas ejected from the gas supplier 9 is diffused around the substantially center portion of the surface to be processed of the substrate W. Thus, the metal removal liquid discharged from the peripheral portion cleaning nozzle 8 is prevented from adhering to the coating film formed on the surface to be processed of the substrate W.

Figure 6:
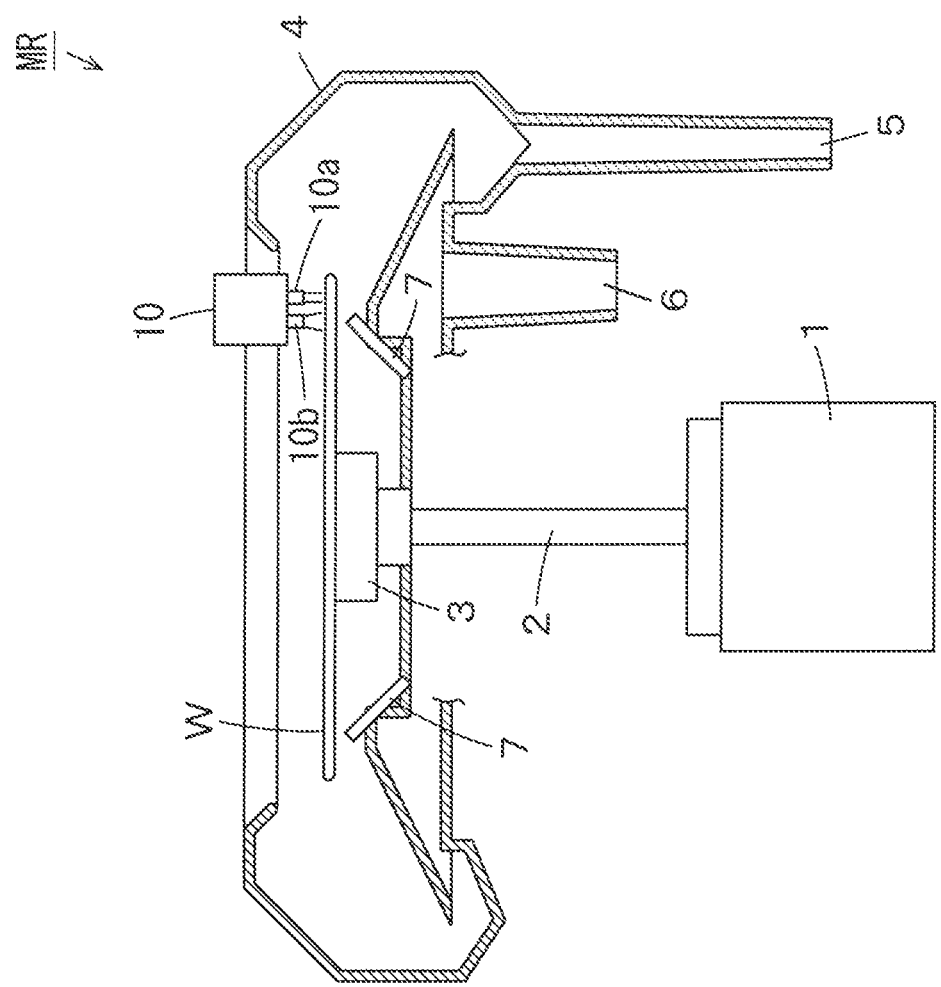
FIG. 6 is a diagram showing an example of a second configuration of the metal removal unit.

FIG. 6 is a diagram showing an example of a second configuration of a metal removal unit MR. As shown in FIG. 6, the metal removal unit MR in the example of the second configuration is provided with a gas-liquid supply nozzle 10 instead of the peripheral portion cleaning nozzle 8 and the gas supplier 9 of FIG. 5. The gas-liquid supply nozzle 10 includes a liquid nozzle 10a and a gas nozzle 10b arranged in a horizontal direction. The gas-liquid supply nozzle 10 is arranged to be directed to the peripheral portion of the substrate W held by the spin chuck 3. Here, the gas nozzle 10b is located closer to the center of the substrate W than the liquid nozzle 10a.

A metal removal liquid is discharged to the peripheral portion of the substrate W from the liquid nozzle 10a. An inert gas, for example, a nitrogen gas, is ejected to the peripheral portion of the substrate W from the gas nozzle 10b. In this case, a position in the substrate W to which the gas is ejected from the gas nozzle 10b is closer to the center of the substrate W than a position in the substrate W to which the metal removal liquid is discharged from the liquid nozzle 10a is. Thus, the metal removal liquid discharged from the liquid nozzle 10a is prevented by the gas ejected from the gas nozzle 10b from spreading towards the center of the substrate W. This prevents the metal removal liquid discharged from the liquid nozzle 10a from adhering to the coating film formed on the surface to be processed of the substrate W.

Further, in the example of the first or second configuration of the metal removal unit MR, the metal-containing coating film is cured by the thermal processing section 123. Thus, even when gas is discharged to the substrate W from the gas supplier 9 or the gas nozzle 10b, it does not affect the film thickness of the metal-containing coating film. As a result, the metal-containing coating film having a uniform thickness can be formed on the surface to be processed of the substrate W.

(5) Transport Sections

Figure 7:
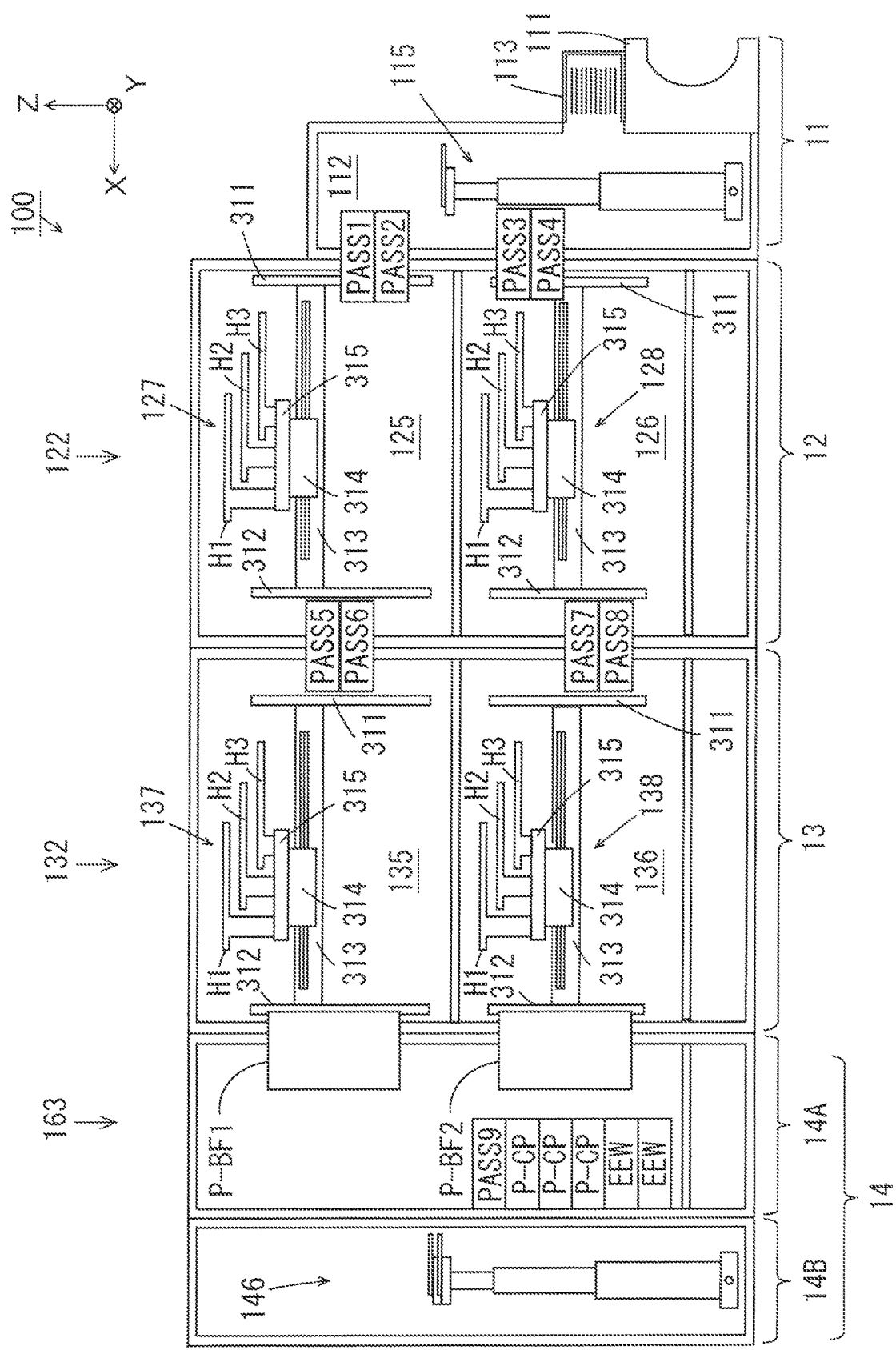
FIG. 7 is a schematic side view showing an inner configurations of transport sections.

FIG. 7 is a schematic side view showing inner configurations of the transport sections 122, 132, 163. As shown in FIG. 7, the transport section 122 has an upper transport chamber 125 and a lower transport chamber 126. The transport section 132 has an upper transport chamber 135 and a lower transport chamber 136. A transport mechanism 127 is provided in the upper transport chamber 125, and a transport mechanism 128 is provided in the lower transport chamber 126. Further, a transport mechanism 137 is provided in the upper transport chamber 135, and a transport mechanism 138 is provided in the lower transport chamber 136.

The upper thermal processing section 301 (FIG. 4) is opposite to the coating processing chambers 21, 22 (FIG. 2) with the upper transport chamber 125 interposed therebetween. The lower thermal processing section 302 (FIG. 4) is opposite to the coating processing chambers 23, 24 (FIG. 2) with the lower transport chamber 126 interposed therebetween. The upper thermal processing section 303 (FIG. 4) is opposite to the development processing chambers 31, 32 (FIG. 2) with the upper transport chamber 135 interposed therebetween. The lower thermal processing section 304

(FIG. 4) is opposite to the development processing chambers 33, 34 (FIG. 2) with the lower transport chamber 136 interposed therebetween.

The substrate platforms PASS1, PASS2 are provided between the transport section 112 and the upper transport chamber 125, and the substrate platforms PASS3, PASS4 are provided between the transport section 112 and the lower transport chamber 126. The substrate platforms PASS5, PASS6 are provided between the upper transport chamber 125 and the upper transport chamber 135, and the substrate platforms PASS7, PASS8 are provided between the lower transport chamber 126 and the lower transport chamber 136.

The placement buffer unit P-BF1 is provided between the upper transport chamber 135 and the transport section 163, and the placement buffer unit P-BF2 is provided between the lower transport chamber 136 and the transport section 163. The substrate platform PASS9, the plurality of edge exposure units EEW and the plurality of placement cooling units P-CP are provided in the transport section 163 to be adjacent to the carry-in carry-out block 14B.

The placement buffer unit P-BF1 is configured such that the substrate W can be carried in and carried out from the placement buffer unit P-BF1 by the transport mechanism 137 and the transport mechanisms 141, 142 (FIG. 1). The placement buffer unit P-BF2 is configured such that the substrate W can be carried in and carried out from the placement buffer unit P-BF2 by the transport mechanism 138 and the transport mechanisms 141, 142 (FIG. 1). Further, the substrate platform PASS9, the edge exposure units EEW and the placement cooling units P-CP are configured such that the substrates W can be carried in and carried out from the substrate platform PASS9, the edge exposure units EEW and the placement cooling units P-CP by the transport mechanisms 141, 142 (FIG. 1) and the transport mechanism 146.

In the edge exposure unit EEW, exposure processing (edge exposure processing) for the peripheral portion of the substrate W is performed. The edge exposure processing is performed on the substrate W, so that a resist film on the peripheral portion of the substrate W is removed during the subsequent development processing. Thus, in the case where the peripheral portion of the substrate W comes into contact with another member after the development processing, the resist film on the peripheral portion of the substrate W is prevented from being stripped and becoming particles.

The substrates W transported from the indexer block 11 to the first processing block 12 are placed on the substrate platform PASS1 and the substrate platform PASS3. The substrates W transported from the first processing block 12 to the indexer block 11 are placed on the substrate platform PASS2 and the substrate platform PASS4.

The substrates W transported from the first processing block 12 to the second processing block 13 are placed on the substrate platform PASS5 and the substrate platform PASS7. The substrates W transported from the second processing block 13 to the first processing block 12 are placed on the substrate platform PASS6 and the substrate platform PASS8.

The substrates W transported from the second processing block 13 to the cleaning drying processing block 14A are placed on the placement buffer units P-BF1, P-BF2. The substrates W transported from the cleaning drying processing block 14A to the carry-in carry-out block 14B are placed on the placement cooling units P-CP. The substrate W transported from the carry-in carry-out block 14B to the cleaning drying processing block 14A are placed on the substrate platform PASS9.

Figure 8:
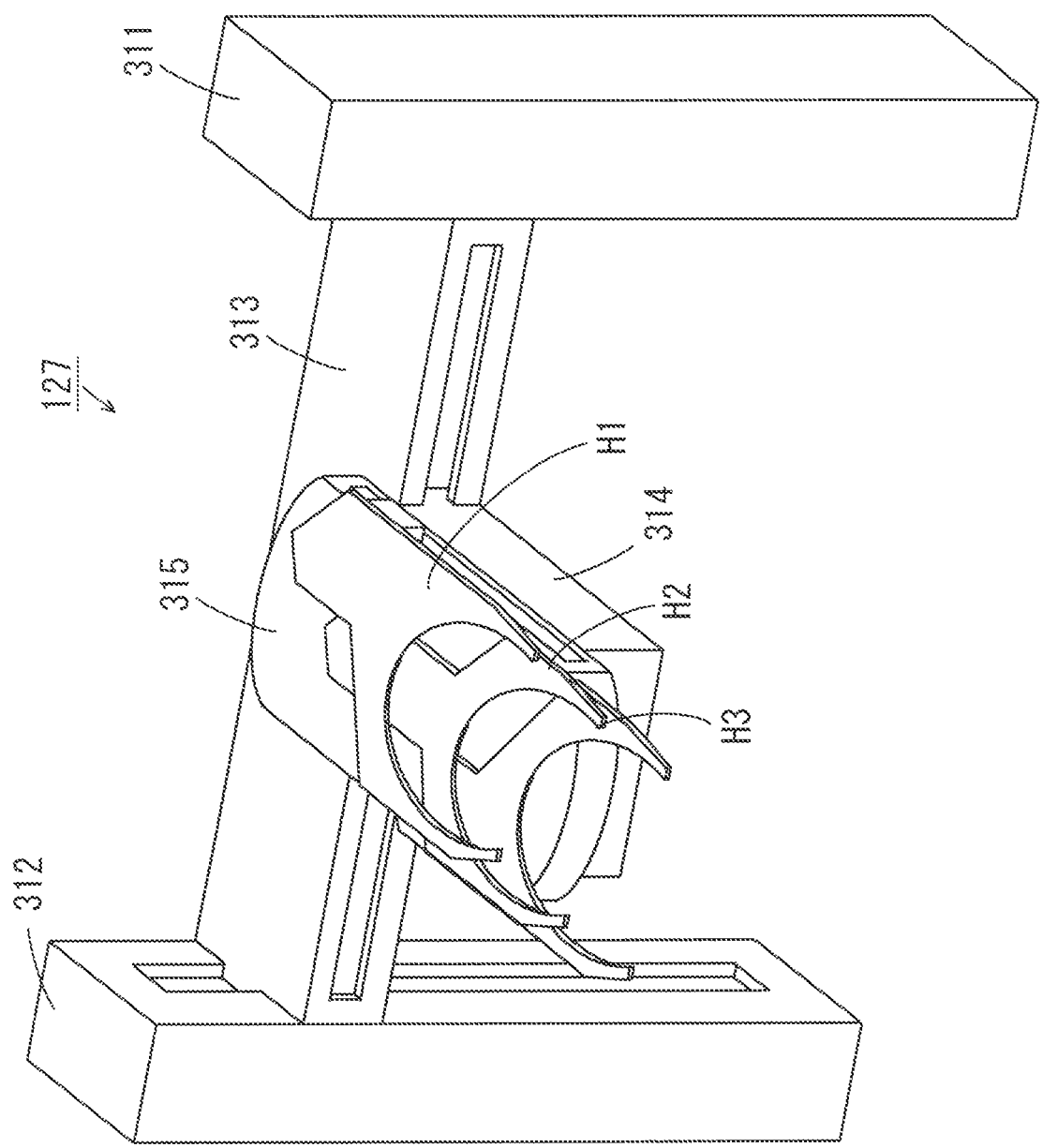
FIG. 8 is a perspective view showing a transport mechanism.

Next, the transport mechanism 127 will be described. FIG. 8 is a perspective view showing the transport mechanism 127. As shown in FIGS. 7 and 8, the transport mechanism 127 includes elongated guide rails 311, 312. As shown in FIG. 7, the guide rail 311 is fixed to the side surface close to the transport section 112 to extend in an up-and-down direction in the upper transport chamber 125. The guide rail 312 is fixed to the side surface close to the upper transport chamber 135 to extend in the up-and-down direction in the upper transport chamber 125.

An elongated guide rail 313 is provided between the guide rail 311 and the guide rail 312. The guide rail 313 is attached to the guide rails 311, 312 to be movable in the up-and-down direction. A moving member 314 is attached to the guide rail 313. The moving member 314 is provided to be movable in a longitudinal direction of the guide rail 313.

An elongated rotation member 315 is rotatably provided on an upper surface of the moving member 314. Hands H1, H2, H3 for holding outer peripheries of the substrates W are attached to the rotation member 315. The hands H1, H2, H3 are provided to be movable in a longitudinal direction of the rotation member 315. The hand H1 is arranged above the hand H2, and the hand H2 is arranged above the hand H3.

The above-mentioned configuration enables the transport mechanism 127 to move in the X and Z directions in the upper transport chamber 125. The transport mechanism 127 can receive the substrates W from and transfer the substrates W to the coating processing chambers 21, 22 (FIG. 2), the substrate platforms PASS1, PASS2, PASS5, PASS6 (FIG. 7) and the upper thermal processing section 301 (FIG. 4) using the hands H1 to H3.

As shown in FIG. 7, the transport mechanisms 128, 137, 138 have the configuration similar to that of the transport mechanism 127. Further, in the present embodiment, the transport mechanism 141 of FIG. 1 has three hands H1 to H3 similar to those of the transport mechanism 127.

(6) Substrate Processing

The substrate processing will be described with reference to FIGS. 1, 2, 4, and 7. Each carrier 113 in which unprocessed substrates W are stored is placed on each carrier platform 111 (FIG. 1) in the indexer block 11. The transport mechanism 115 transports the unprocessed substrate W from the carrier 113 to each of the substrate platforms PASS1, PASS3 (FIG. 7). Further, the transport mechanism 115 transports the processed substrate W that is placed on each of the substrate platforms PASS2, PASS4 (FIG. 7) to the carrier 113.

In the first processing block 12, the transport mechanism 127 (FIG. 7) sequentially transports the unprocessed substrate W that is placed on the substrate platform PASS1 to the adhesion reinforcement processing unit PAHP (FIG. 4), the cooling unit CP (FIG. 4) and the coating processing chamber 22 (FIG. 2) using the middle hand H2 and the lower hand H3. Next, the transport mechanism 127 sequentially transports the substrate W in the coating processing chamber 22 to the thermal processing unit PHP (FIG. 4), the cooling unit CP (FIG. 4), the coating processing chamber 21 (FIG. 2), the thermal processing unit PHP (FIG. 4) and the substrate platform PASS5 (FIG. 7) using the hands H2, H3.

In this case, the adhesion reinforcement processing is performed on the substrate W in the adhesion reinforcement processing unit PAHP, and then the substrate W is cooled in the cooling unit CP to a temperature suitable for the formation of the anti-reflection film. Next, an anti-reflection film is formed on the substrate W by the coating processing unit 129 (FIG. 2) in the coating processing chamber 22. Subsequently, the thermal processing for the substrate W is performed in the thermal processing unit PHP, and then the substrate W is cooled in the cooling unit CP to a temperature suitable for the formation of the resist film. Then, a resist film is formed on the substrate W by the coating processing unit 129 (FIG. 2) in the coating processing chamber 21. Thereafter, the thermal processing for the substrate W is performed in the thermal processing unit PHP, and the substrate W is placed on the substrate platform PASS5.

Further, the transport mechanism 127 transports the substrate W on which the development processing has been performed and which is placed on the substrate platform PASS6 (FIG. 7) to the substrate platform PASS2 (FIG. 7) using the upper hand H1.

The transport mechanism 128 (FIG. 7) sequentially transports the unprocessed substrate W that is placed on the substrate platform PASS3 to the adhesion reinforcement processing unit PAHP (FIG. 4), the cooling unit CP (FIG. 4) and the coating processing chamber 24 (FIG. 2) using the middle hand H2 and the lower hand H3. Next, the transport mechanism 128 sequentially transports the substrate W in the coating processing chamber 24 to the thermal processing unit PHP (FIG. 4), the cooling unit CP (FIG. 4), the coating processing chamber 23 (FIG. 2), the thermal processing unit PHP (FIG. 4) and the substrate platform PASS7 (FIG. 7) using the hands H2, H3.

Further, the transport mechanism 128 (FIG. 7) transports the substrate W on which the development processing has been performed and which is placed on the substrate platform PASS8 (FIG. 7) to the substrate platform PASS4 (FIG. 7) using the upper hand H1. The contents of processing for the substrate W in the coating processing chambers 23, 24 (FIG. 2) and the lower thermal processing section 302 (FIG. 4) are respectively similar to the contents of processing for the substrate W in the above-mentioned coating processing chambers 21, 22 (FIG. 2) and the upper thermal processing section 301 (FIG. 4).

In the second processing block 13, the transport mechanism 137 (FIG. 7) transports the substrate W on which the resist film has been formed and which is placed on the substrate platform PASS5 to the placement buffer unit P-BF1 (FIG. 7) using the lower hand H3.

Further, the transport mechanism 137 (FIG. 7) takes out the substrate Won which the exposure processing and the thermal processing have been performed from the thermal processing unit PHP (FIG. 4) adjacent to the cleaning drying processing block 14A using the upper hand H1 and the middle hand H2. The transport mechanism 137 sequentially transports the substrate W to the cooling unit CP (FIG. 4), one of the development processing chambers 31, 32 (FIG. 2), the thermal processing unit PHP (FIG. 4) and the substrate platform PASS6 (FIG. 7) using the hands H1, H2.

In this case, the substrate W is cooled in the cooling unit CP to a temperature suitable for the development processing, and then the development processing for the substrate W is performed by the development processing unit 139 in any one of the development processing chambers 31, 32. Thereafter, the thermal processing for the substrate W is performed in the thermal processing unit PHP, and the substrate W is placed on the substrate platform PASS6.

The transport mechanism 138 (FIG. 7) transports the substrate W on which the resist film has been formed and which is placed on the substrate platform PASS7 to the placement buffer unit P-BF2 (FIG. 7) using the lower hand H3.

Further, the transport mechanism 138 (FIG. 7) takes out the substrate Won which the exposure processing and the thermal processing have been performed from the thermal processing unit PHP (FIG. 4) adjacent to the interface block 14 using the upper hand H1 and the middle hand H2. The transport mechanism 138 sequentially transports the substrate W to the cooling unit CP (FIG. 4), any one of the development processing chambers 33, 34 (FIG. 2), the thermal processing unit PHP (FIG. 4) and the substrate platform PASS8 (FIG. 7) using the hands H1, H2. The contents of processing for the substrate W in the development processing chambers 33, 34, and the lower thermal processing section 304 are respectively similar to the contents of processing for the substrate W in the above-mentioned development processing chambers 31, 32, and the upper thermal processing section 303.

In the cleaning drying processing block 14A, the transport mechanism 141 (FIG. 1) transports the substrate W placed on each of the placement buffer units P-BF1, P-BF2 (FIG. 7) to the metal removal unit MR (FIG. 4) using the lower hand H3. Further, the transport mechanism 141 sequentially transports the substrate Win the metal removal unit MR to the cleaning drying processing unit BSS (FIG. 2), the edge exposure unit EEW and the placement cooling unit P-CP (FIG. 7) using the upper hand H1 and the middle hand H2.

In this case, a metal component remaining in the peripheral portion and the back surface of the substrate W is removed in the metal removal unit MR. Further, the peripheral portion and the back surface of the substrate W are cleaned and dried in the cleaning drying processing unit BSS. Subsequently, the edge exposure processing for the substrate W is performed in the edge exposure unit EEW. Thereafter, the substrate W is cooled in the placement cooling unit P-CP to a temperature suitable for the exposure processing by the exposure device 15 (FIG. 1).

The transport mechanism 142 (FIG. 1) sequentially transports the substrate Won which the exposure processing has been performed and which is placed on the substrate platform PASS9 (FIG. 7) to the thermal processing unit PHP (FIG. 4) in the upper thermal processing section 303 or the lower thermal processing section 304. In this case, post-exposure bake (PEB) processing is performed in the thermal processing unit PHP.

In the carry-in carry-out block 14B, the transport mechanism 146 (FIG. 1) transports the substrate W on which the exposure processing has not been performed and which is placed on the placement cooling unit P-CP (FIG. 7) to a substrate inlet of the exposure device 15 (FIG. 1). Further, the transport mechanism 146 takes out the substrate W on which the exposure processing has been performed from a substrate outlet of the exposure device 15, and transports the substrate W to the substrate platform PASS9 (FIG. 7).

In the above-mentioned transportation of the substrate W, the substrate W from which a metal component has not been removed and the substrate W from which a metal component has been removed are held by different hands of the transport mechanisms 127, 128, 137, 138, 141. Thus, a metal component is prevented from adhering to the substrate W from which a metal component has been removed via the hands of the transport mechanisms 127, 128, 137, 138, 141.

In the present embodiment, the processing for the substrates W in the coating processing chambers 21, 22, the development processing chambers 31, 32 and the upper thermal processing sections 301, 303 provided above, and the processing for the substrates Win the coating processing chambers 23, 24, the development processing chambers 33, 34 and the lower thermal processing sections 302, 304 provided below can be concurrently performed. Thus, it is possible to improve throughput without increasing a footprint.

(7) Effects

In the substrate processing apparatus 100 according to the present embodiment, the metal-containing coating liquid is supplied to the surface to be processed of the substrate W by the coating liquid nozzle 28. Thus, the metal-containing coating film is formed on the surface to be processed of the substrate W. The substrate W on which the metal-containing coating film has been formed is transported to the metal removal unit MR by the transport mechanisms 127, 128, 137, 138, 141.

The metal removal liquid is supplied to the peripheral portion of the substrate W by the metal removal unit MR. Thus, a metal component in the metal-containing coating film in the peripheral portion of the substrate W is dissolved, and the metal-containing coating film remains in a region except for the peripheral portion of the surface to be processed of the substrate W. Further, even when the metal-containing coating liquid flows to the back surface of the substrate W, a metal component in the metal-containing coating liquid adhering to the back surface of the substrate W is removed by the metal removal unit MR.

In this configuration, the metal-containing coating film is formed on the surface to be processed of the substrate W except for the peripheral portion, and a metal component is prevented from remaining in the peripheral portion and the back surface of the substrate W. Therefore, even when each of the transport mechanisms 115, 127, 128, 137, 138, 141, 142, 146 holds the peripheral portion of the substrate W, a metal component does not adhere to the transport mechanisms 115, 127, 128, 137, 138, 141, 142, 146. Thus, the metal-containing coating film can be formed on the substrate W, and an occurrence of metallic contamination can be prevented.

[2] Second Embodiment

Figure 9:
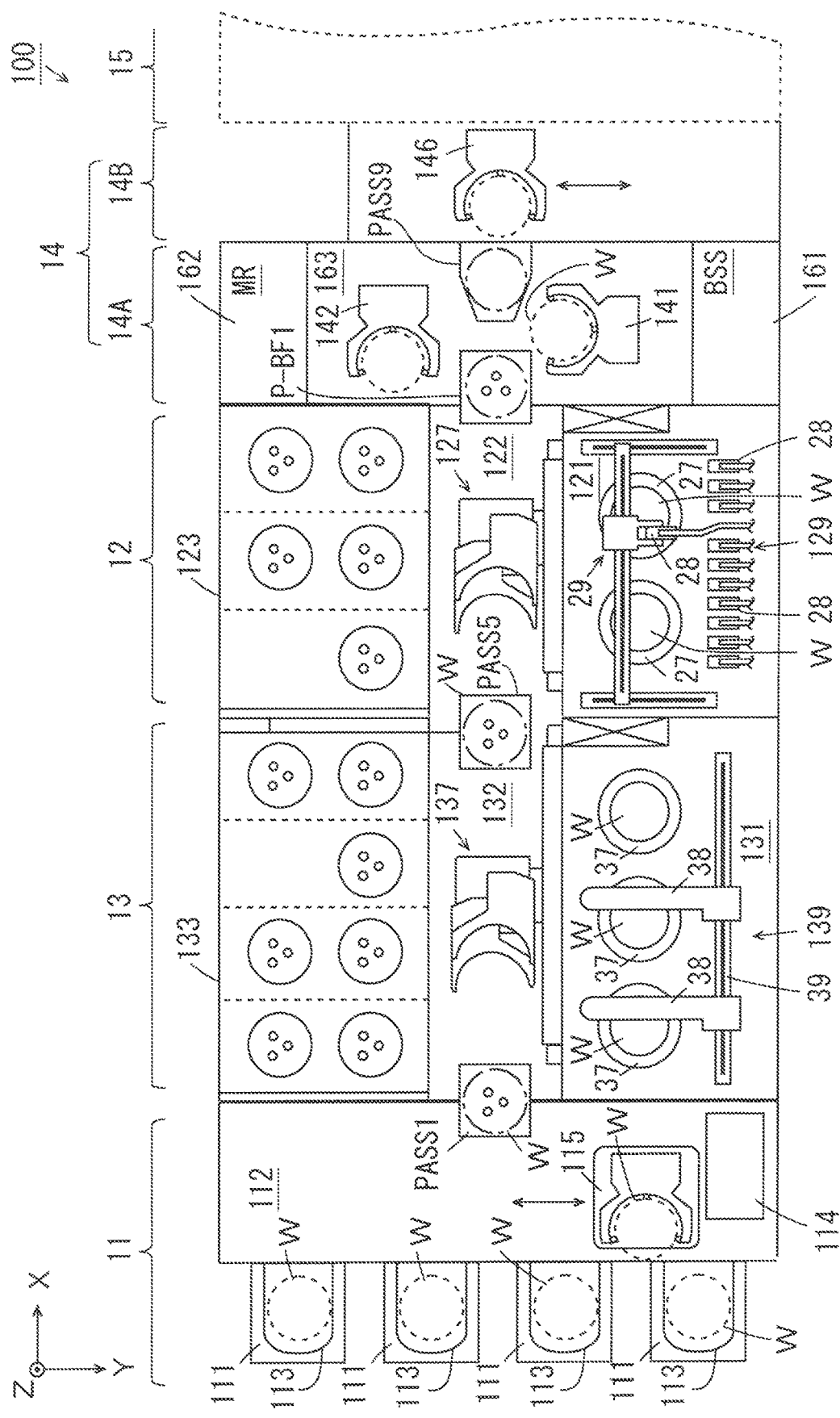
FIG. 9 is a schematic plan view of a substrate processing apparatus according to a second embodiment of the present invention.

As for a substrate processing apparatus according to the second embodiment, differences from the substrate processing apparatus 100 according to the first embodiment will be described. FIG. 9 is a schematic plan view of the substrate processing apparatus according to the second embodiment of the present invention. As shown in FIG. 9, in the present embodiment, a second processing block 13 is arranged between an indexer block 11 and a first processing block 12.

In the substrate processing apparatus 100 of FIG. 9, a substrate W is transported from the indexer block 11 to the first processing block 12 by transport mechanisms 137, 138 of the second processing block 13. In the first processing block 12, an anti-reflection film and a resist film are formed on the substrate W. Thereafter, the substrate W is transported to an exposure device 15 through an interface block 14, and is exposed by the exposure device 15.

The exposed substrate W is transported to the second processing block 13 by transport mechanisms 127, 128 of the first processing block 12. In the second processing block 13, development processing is performed on the substrate W. The developed substrate W is transported to the indexer block 11 by the transport mechanisms 137, 138.

In the above-mentioned configuration, metal in a metal-containing coating film in a peripheral portion of the substrate W is immediately removed by a metal removal unit MR in a cleaning drying processing section 162 adjacent to a coating processing section 121. Thus, the substrate processing apparatus 100 can be sufficiently prevented from being contaminated by metal.

[3] Third Embodiment

Figure 10:
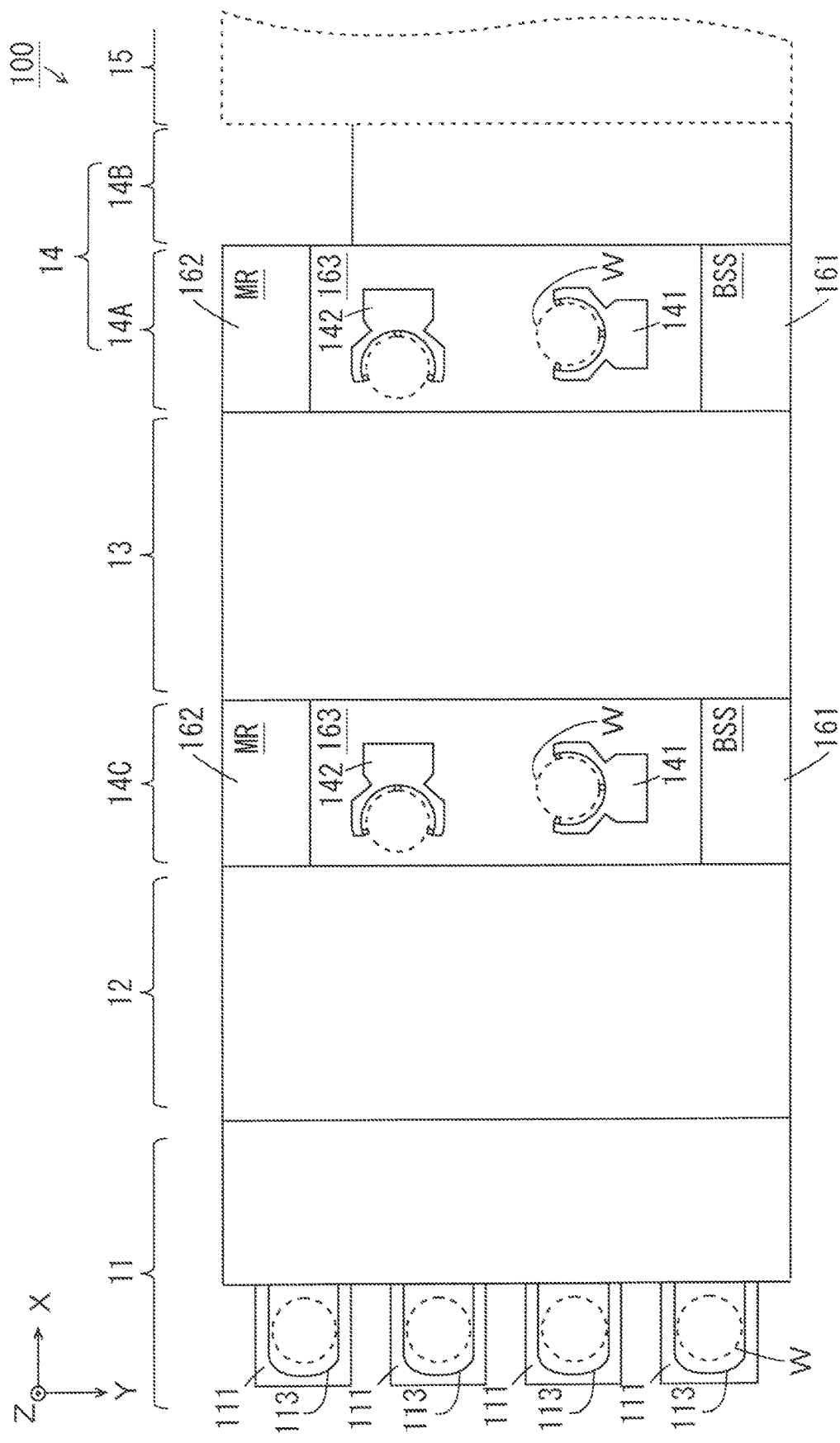
FIG. 10 is a schematic plan view of a substrate processing apparatus according to a third embodiment of the present invention.

As for a substrate processing apparatus according to the third embodiment, differences from the substrate processing apparatus 100 according to the first embodiment will be described. FIG. 10 is a schematic plan view of the substrate processing apparatus according to the third embodiment of the present invention. As shown in FIG. 10, in the present embodiment, a cleaning drying processing block 14C having the same configuration as that of the cleaning drying processing block 14A is arranged between a first processing block 12 and a second processing block 13.

In the substrate processing apparatus 100 of FIG. 10, a substrate W on which an anti-reflection film and a resist film are formed in the first processing block 12 is transported to the adjacent cleaning drying processing block 14C. In the cleaning drying processing block 14C, a metal component remaining in a peripheral portion and a back surface of the substrate W is removed by a metal removal unit MR. Further, the peripheral portion and the back surface of the substrate W are cleaned and dried by a cleaning drying processing unit BSS. Thereafter, the substrate W is transported to the adjacent second processing block 13.

[4] Fourth Embodiment

Figure 11:
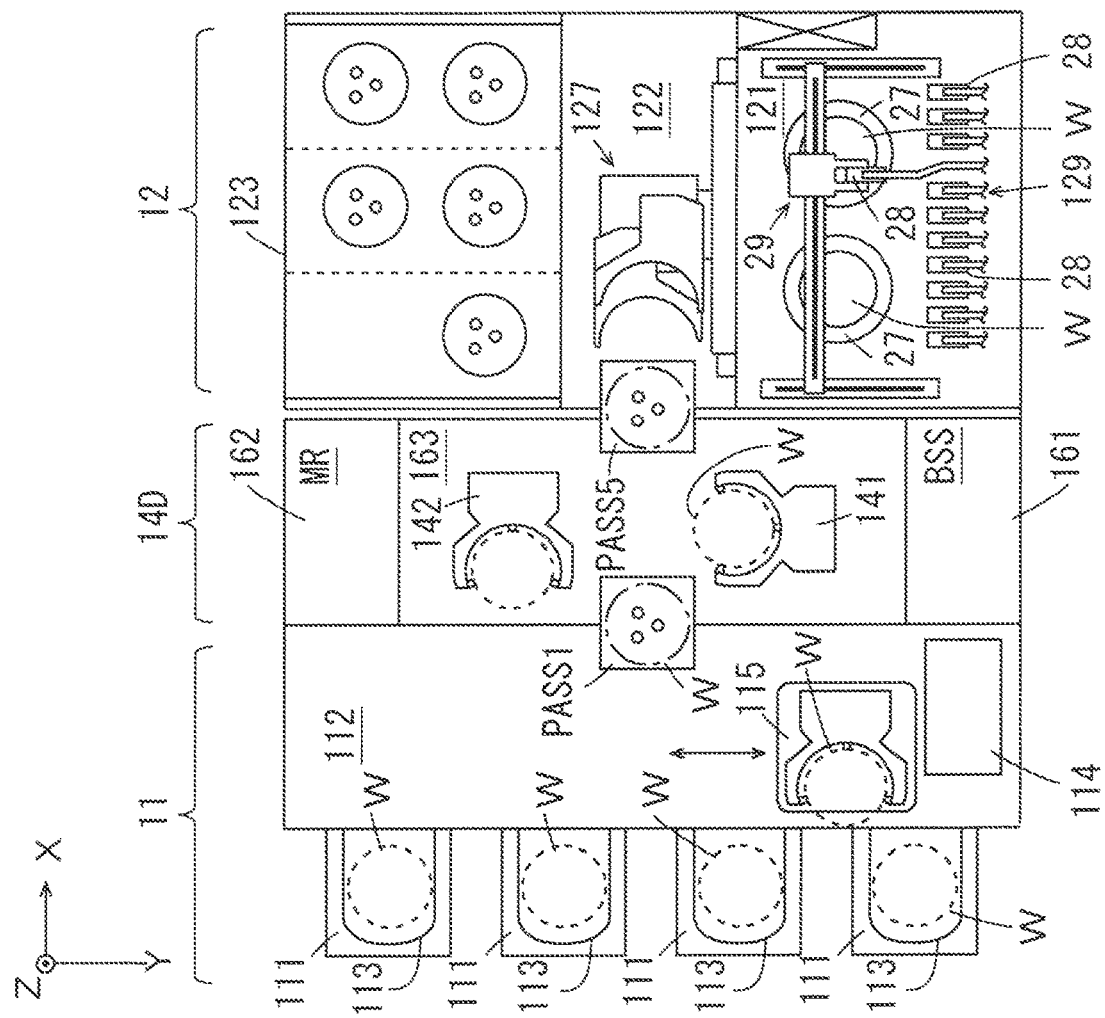
FIG. 11 is a schematic plan view of a substrate processing apparatus according to a fourth embodiment of the present invention.

As for a substrate processing apparatus according to the fourth embodiment, differences from the substrate processing apparatus 100 according to the first embodiment will be described. FIG. 11 is a schematic plan view of the substrate processing apparatus according to the fourth embodiment of the present invention. As shown in FIG. 11, in the present embodiment, a second processing block 13 and an interface block 14 of FIG. 1 are not provided in the substrate processing apparatus 100. Further, a cleaning drying processing block 14D having the same configuration as that of the cleaning drying processing block 14A is arranged between an indexer block 11 and a first processing block 12.

In the substrate processing apparatus 100 of FIG. 11, a substrate W is transported from the indexer block 11 to the first processing block 12 by a transport mechanism 141 of the cleaning drying processing block 14D. In the first processing block 12, an anti-reflection film and a resist film are formed on the substrate W.

The substrate W in the first processing block 12 is transported to a metal removal unit MR (FIG. 4) in a cleaning drying processing section 162 in the cleaning drying processing block 14D by the transport mechanism 141 of the cleaning drying processing block 14D. Thereafter, the substrate W in the metal removal unit MR is transported to a cleaning drying processing unit BSS (FIG. 2) in a cleaning drying processing section 161 by a transport mechanism 142.

In the cleaning drying processing block 14D, a metal component remaining in a peripheral portion and a back surface of the substrate W is removed by the metal removal unit MR. Further, the peripheral portion and the back surface of the substrate W are cleaned and dried by the cleaning drying processing unit BSS. Thereafter, the substrate W is transported to the indexer block 11 by the transport mechanism 142.

In the present embodiment, an edge exposure unit EEW of FIG. 7 may be provided in the cleaning drying processing block 14D, or may be provided in the first processing block 12. Alternatively, in the case where it is not necessary to perform edge exposure processing on the substrate W in the substrate processing apparatus 100, the edge exposure unit EEW does not have to be provided in the substrate processing apparatus 100.

[5] Fifth Embodiment (1) Coating Metal-Removal Unit

As for a substrate processing apparatus according to the fifth embodiment, differences from the substrate processing apparatus according to the first embodiment will be described. In the present embodiment, a cleaning drying processing section 162 (a metal removal unit MR) is not provided in a cleaning drying processing block 14A of FIG. 1. Further, a coating metal-removal unit is provided instead of the coating processing unit 129 of FIG. 2.

Figure 12:
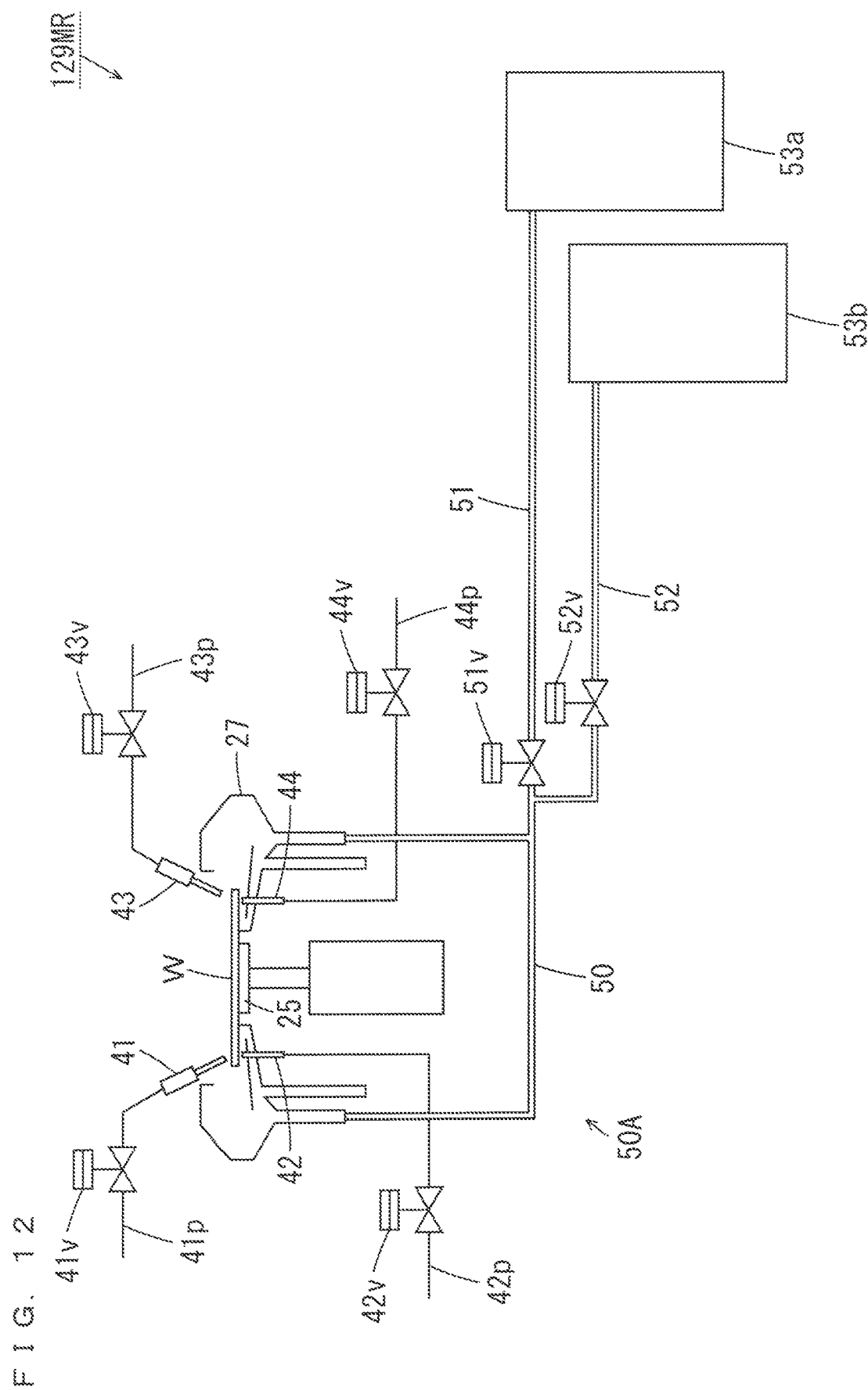
FIG. 12 is a schematic side view showing an example of a configuration of a coating metal-removal unit in a fifth embodiment of the present invention.

FIG. 12 is a schematic side view showing a configuration of the coating metal-removal unit in the fifth embodiment of the present invention. As shown in FIG. 12, each coating metal-removal unit 129MR includes edge rinse nozzles 41, 43 and back rinse nozzles 42, 44 corresponding to each spin chuck 25. The edge rinse nozzles 41, 43 are arranged to be directed to a peripheral portion of a surface to be processed of a substrate W held by the spin chuck 25. The back rinse nozzles 42, 44 are arranged to be directed to a back surface of the substrate W held by the spin chuck 25.

Supply pipes 41p, 43p are connected to the edge rinse nozzles 41, 43, respectively. Supply valves 41v, 43v are inserted into the supply pipes 41p, 43p, respectively. Supply pipes 42p, 44p are connected to back rinse nozzles 42, 44, respectively. Supply valves 42v, 44v are inserted into the supply pipes 42p, 44p, respectively.

A removal liquid similar to the above-mentioned film removal liquid is supplied from a first removal liquid supply tank (not shown) to each of the edge rinse nozzle 41 and the back rinse nozzle 42 through each of the supply pipes 41p, 42p as a film removal liquid for the peripheral portion of the substrate W and a cleaning liquid for the back surface of the substrate W. A metal removal liquid is supplied to the edge rinse nozzle 43 and the back rinse nozzle 44 from a second removal liquid supply tank (not shown) through each of the supply pipes 43p, 44p.

In the coating metal-removal unit 129MR, two second supply tanks in which different types of metal removal liquids are respectively stored may be provided. In this case, different types of metal removal liquids can be respectively discharged from the two edge rinse nozzles 43 of each coating metal-removal unit 129MR. Similarly, different types of metal removal liquids can be respectively discharged from the two back rinse nozzles 44 of each coating metal-removal unit 129MR. The metal removal liquids may be discharged from the edge rinse nozzle 43 and the back rinse nozzle 44 with their temperatures adjusted to 30° C. to 40° C., for example.

With the substrate W rotated by the spin chuck 25, the film removal liquid is discharged to the peripheral portion of the substrate W from the edge rinse nozzle 41, and a cleaning liquid is discharged to the back surface of the substrate W from the back rinse nozzle 42. In this case, a coating liquid applied to the peripheral portion and the back surface of the substrate W is dissolved. Thus, the coating liquid in the peripheral portion and the back surface of the substrate W is removed.

Further, with the substrate W rotated by the spin chuck 25, the metal removal liquid is discharged to the peripheral portion of the substrate W from the edge rinse nozzle 43, and the metal removal liquid is discharged to the back surface of the substrate W from the back rinse nozzle 44. In this case, a metal component remaining in the peripheral portion and the back surface of the substrate W is dissolved. Thus, a metal component remaining in the peripheral portion and the back surface of the substrate W is removed.

(2) Collection of Removal Liquids

As described above, in the substrate processing performed in the coating metal-removal unit 129MR, the film removal liquid, the cleaning liquid that is the same liquid as the film removal liquid, and the metal removal liquid are used. Therefore, it is preferable that the used film removal liquid and the used cleaning liquid are collected from a cup 27 separately from the metal removal liquid. Thus, as shown in FIG. 12, a collection pipe 50 is connected to a liquid discharger of the cup 27. The collection pipe 50 branches into two branch pipes 51, 52 at its downstream position. Collection valves 51v, 52v are inserted into the branch pipes 51, 52, respectively. The branch pipes 51, 52 are connected to collection tanks 53a, 53b, respectively.

In this manner, in the present embodiment, a removal liquid collection unit 50A is constituted by the cup 27, the branch pipes 51, 52, the collection valves 51v, 52v, the collection tanks 53a, 53b and the local controller LC1 of FIG. 4.

Figure 13:
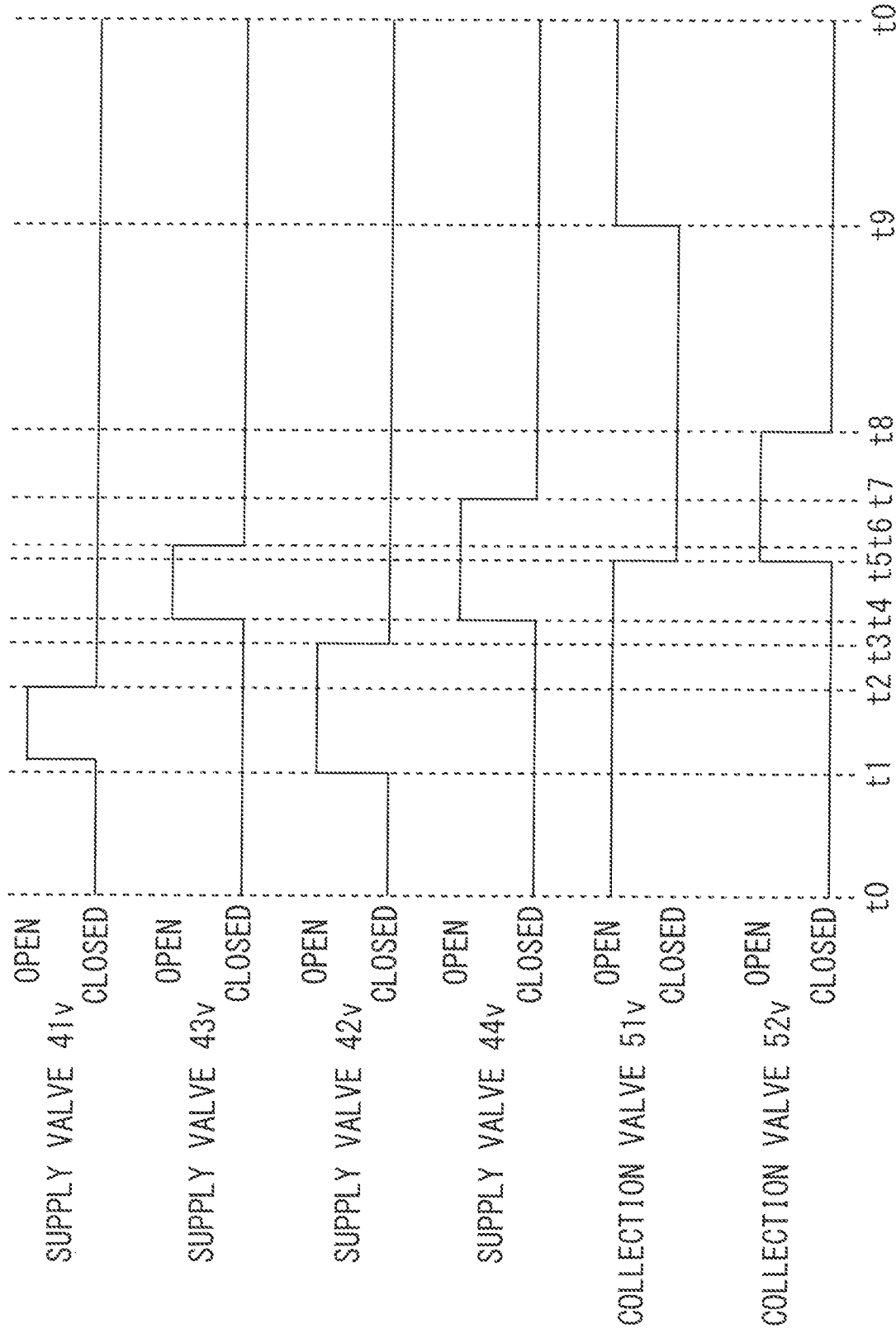
FIG. 13 is a time chart showing operations of supply valves and collection valves.

FIG. 13 is a time chart showing operations of the supply valves 41v to 44v and the collection valves 51v, 52v. The operations of the supply valves 41v to 44v and the collection valves 51v, 52v are controlled by the local controller LC1.

As shown in FIG. 13, at an initial time point t0, the supply valves 41v to 44v and the collection valve 52v are closed, and the collection valve 51v is opened. Thereafter, at a time point t1, the supply valves 42v, 41v are sequentially opened. Thus, the cleaning liquid and the film removal liquid are sequentially discharged to the back surface and the peripheral portion of the substrate W from the back rinse nozzle 42 and the edge rinse nozzle 41, respectively.

The cleaning liquid and the film removal liquid discharged to the substrate W are shaken off by rotation of the substrate W and led from the liquid discharger of the cup 27 to the downstream of the collection pipe 50 through the collection pipe 50. Then, the collection valve 51v of the branch pipe 51 is opened, and the collection valve 52v of the branch pipe 52 is closed. Therefore, the cleaning liquid and the film removal liquid are collected by the collection tank 53a through the branch pipe 51.

The supply valve 41v is closed at a time point t2 that is later than the time point t1, and the supply valve 42v is closed at a time point t3 that is later than the time point t2. Thus, the edge rinse nozzle 41 and the back rinse nozzle 42 sequentially stop discharging the film removal liquid and the cleaning liquid to the substrate W.

At a time point t4 that is later than the time point t3, the supply valves 44v, 43v are sequentially opened. The back rinse nozzle 44 and the edge rinse nozzle 43 sequentially discharge the metal removal liquid to the back surface and the peripheral portion of the substrate W, respectively. At a time point t5 that is later than the time point t4, the collection valve 51v is closed, and the collection valve 52v is opened.

The metal removal liquid discharged to the substrate W is shaken off by the rotation of the substrate W, and is led to the downstream of the collection pipe 50 from the liquid discharger of the cup 27 through the collection pipe 50. Here, the collection valve 52v of the branch pipe 52 is opened, and the collection valve 51v of the branch pipe 51 is closed. Therefore, the metal removal liquid is collected in the collection tank 53b through the branch pipe 52.

The supply valve 43v is closed at a time point t6 that is later than the time point t5, and the supply valve 44v is closed at a time point t7 that is later than the time point t6. Thus, discharging of the metal removal liquid from the edge rinse nozzle 43 and the back rinse nozzle 44 to the substrate W is sequentially stopped. The collection valve 52v is closed at a time point t8 that is later than the time point t7, and the collection valve 51v is opened at a time point t9 that is later than the time point t8. Thereafter, the processing performed from the time points t0 to t9 is repeated.

In this manner, in a method of collecting the removal liquid in the present embodiment, the used cleaning liquid and the used film removal liquid are separated from the used metal removal liquid based on periods during which the cleaning liquid, the film removal liquid and the metal removal liquid are discharged. According to this collection method, almost all of the used cleaning liquid and the used film removal liquid are collected in the collection tank 53a, and almost all of the used metal removal liquid is collected in the collection tank 53b. In this case, it is not necessary for a user to perform an operation of separating the cleaning liquid and the film removal liquid from the metal removal liquid. Thus, cost of discarding the removal liquid can be reduced.

Further, in the above-mentioned method of collecting the removal liquid, a period during which the supply valve 42v is opened is longer than a period during which the supply valve 41v is opened. However, the present invention is not limited to this. The period during which the supply valve 42v is opened may be equal to or shorter than the period during which the supply valve 41v is opened. Similarly, in the above-mentioned processing of collecting the removal liquid, the period during which the supply valve 44v is opened is longer than the period during which the supply valve 43v is opened. However, the present invention is not limited to this. The period during which the supply valve 44v is opened may be equal to or shorter than the period during which the supply valve 43v is opened.

Further, in the above-mentioned method of collecting the removal liquid, the collection tanks 53a, 53b are connected to the branch pipes 51, 52 at the downstream of the branch pipes 51, 52, respectively. However, the present invention is not limited to this. The branch pipe 51 may be connected to the collector (not shown) of the cleaning liquid and the film removal liquid at the downstream of the branch pipe 51. Similarly, the branch pipe 52 may be connected to a metal removal liquid collector (not shown) at the downstream of the branch pipe 52.

(3) Effects

In the substrate processing apparatus 100 according to the present embodiment, the metal-containing coating liquid is discharged to the surface to be processed of the substrate W rotated by the spin chuck 25 by the coating liquid nozzle 28. The metal removal liquid is supplied to the peripheral portion of the surface to be processed from the edge rinse nozzle 43, and is supplied to the back surface of the rotating substrate W from the back rinse nozzle 44.

In this case, a metal component in the metal-containing coating liquid in the peripheral portion of the substrate W is dissolved by the edge rinse nozzle 43, and the metal-containing coating film remains in a region except for the peripheral portion of the surface to be processed of the substrate W. Further, even in the case where the metal-containing coating liquid flows to the back surface of the substrate W, a metal component in the metal-containing coating liquid adhering to the back surface of the substrate W is removed by the back rinse nozzle 44.

In this configuration, the metal-containing coating film is formed on the surface to be processed of the substrate W except for the peripheral portion, and metal is prevented from adhering to the peripheral portion and the back surface of the substrate W. Thus, the metal-containing coating film can be formed on the substrate W, and an occurrence of metal contamination can be prevented.

Further, the cleaning liquid and the film removal liquid are supplied to the peripheral portion of the surface to be processed and the back surface of the rotating substrate W by the edge rinse nozzle 41 and the back rinse nozzle 42, respectively. Therefore, the coating liquid applied to the peripheral portion and the back surface of the substrate W is dissolved. Thus, the coating liquid in the peripheral portion of the substrate W is removed. As a result, even when the transport arm grips the peripheral portion of the substrate W, generation of particles can be avoided, and the substrate processing apparatus 100 can be prevented from being contaminated by particles.

[6] Sixth Embodiment

Figure 14:
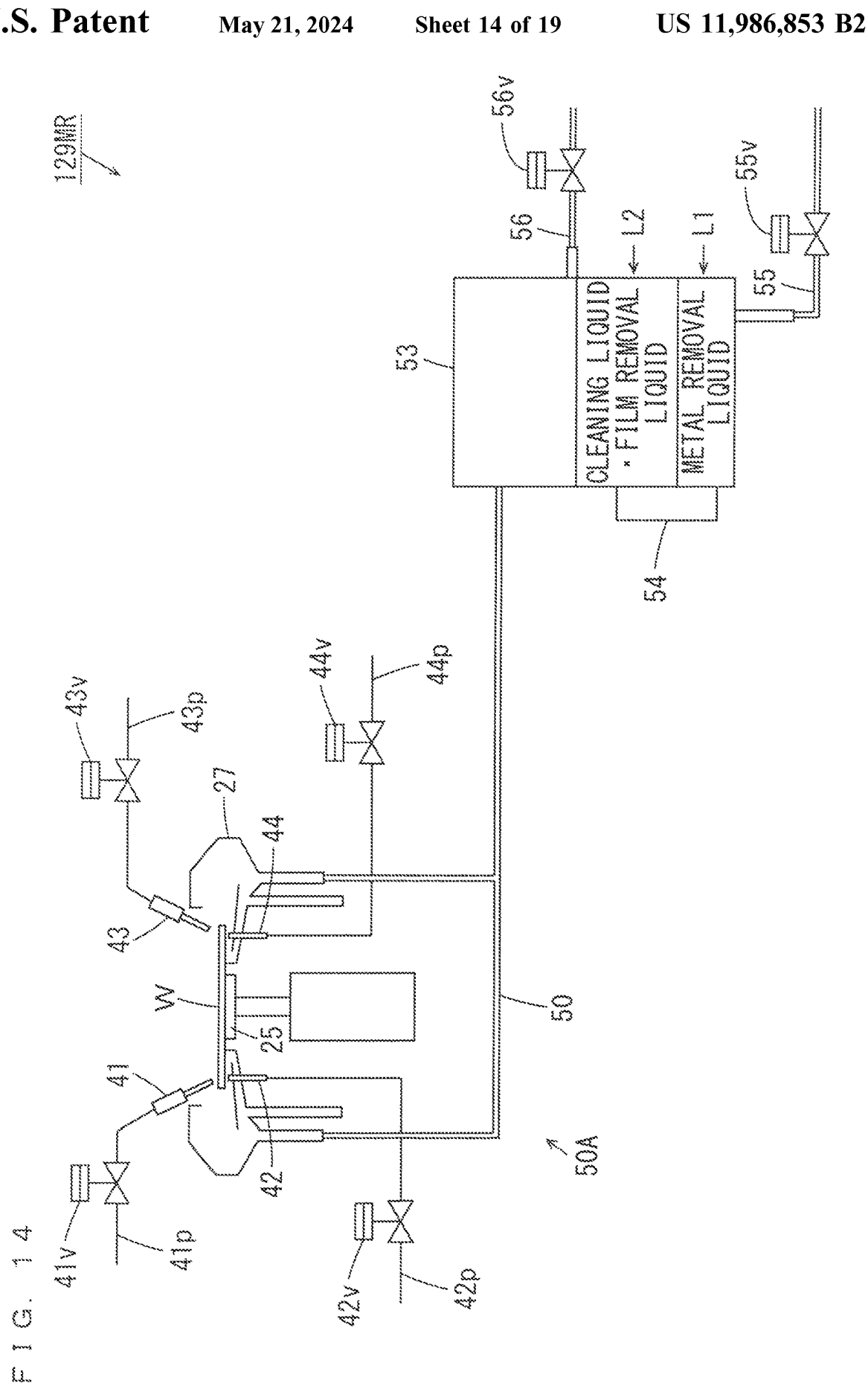
FIG. 14 is a schematic side view showing a configuration of a coating metal-removal unit in a sixth embodiment of the present invention.

As for a substrate processing apparatus according to the sixth embodiment, differences from the substrate processing apparatus 100 according to the fifth embodiment will be described. FIG. 14 is a schematic side view showing a configuration of a coating metal-removal unit in the sixth embodiment of the present invention.

As shown in FIG. 14, in the present embodiment, the coating metal-removal unit 129MR includes a collection tank 53 instead of the collection tanks 53a, 53b of FIG. 12. Further, a collection pipe 50 is connected to the collection tank 53 without branching. In this case, the used cleaning liquid, the used film removal liquid and the used metal removal liquid in the cup 27 are led to the common collection tank 53.

Here, the cleaning liquid and the film removal liquid have specific gravity different from that of the metal removal liquid, and the specific gravity of the metal removal liquid is larger than the specific gravity of the cleaning liquid and the film removal liquid. Therefore, in the collection tank 53, a layer of the metal removal liquid, and a layer of the cleaning liquid and the film removal liquid are formed to be separated into an upper layer and a lower layer. Thus, a boundary detector 54 for detecting a boundary surface between the metal removal liquid, and the cleaning liquid and the film removal liquid is provided in the collection tank 53. While the boundary detector 54 is a capacitance-type liquid surface level sensor in the present embodiment, the present invention is not limited to this. The boundary detector 54 may be a liquid surface level sensor of another type such as a float type, an optical type, an ultrasonic type, an electrical conductivity type or a piezo resonance type.

In the collection tank 53, a lower limit level L1 and an upper limit level L2 for a boundary surface between the metal removal liquid, and the cleaning liquid and the film removal liquid are set. The upper limit level L2 is positioned higher than the lower limit level L1. In the collection tank 53, a collection pipe 55 is attached to a position lower than the lower limit level L1, and a collection pipe 56 is attached to a position higher than the upper limit level L2. The collection pipes 55, 56 are connected to a metal removal liquid collector and a cleaning liquid film-removal liquid collector (not shown), respectively. Collection valves 55v, 56v are inserted into the collection pipes 55, 56, respectively.

In the present embodiment, a removal liquid collection unit 50A is constituted by a cup 27, the collection pipe 50, the collection tank 53, the boundary detector 54, the collection pipes 55, 56 and the collection valves 55v, 56v, and the local controller LC1 of FIG. 4.

Figure 15:
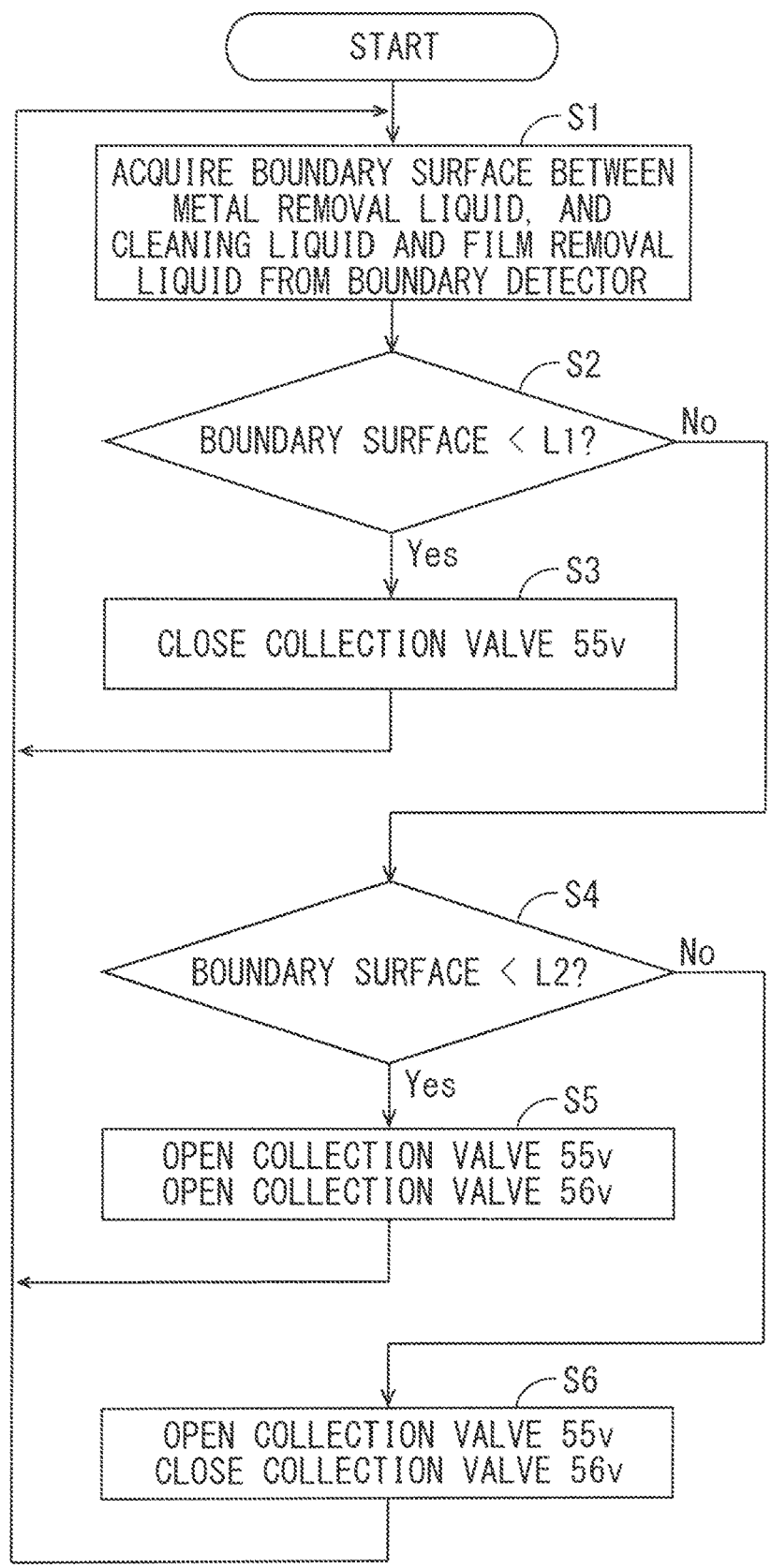
FIG. 15 is a flow chart showing control of collection valves.

FIG. 15 is a flow chart showing the control of the collection valves 55v, 56v. The operations of the collection valves 55v, 56v are controlled by the local controller LC1. Further, operations of the supply valves 41v to 44v are similar to the operations shown in the time chart of FIG. 13.

As shown in FIG. 15, the local controller LC1 acquires a boundary surface between the metal removal liquid, and the cleaning liquid and the film removal liquid in the collection tank 53 from the boundary detector 54 (step S1). Next, the local controller LC1 determines whether the acquired level of the boundary surface is lower than the lower limit level L1 (step S2).

In the case where the level of the boundary surface is lower than the lower limit level L1 in the step S2, the local controller LC1 closes the collection valve 55v (step S3). Thereafter, the local controller CL1 returns to the process of the step S1. At a time point of the step S3, the collection valve 56v may be opened or closed. On the other hand, in the case where the level of the boundary surface is equal to or higher than the lower limit level L1 in the step S2, the local controller LC1 determines whether the level of the boundary surface is lower than the upper limit level L2 (step S4).

In the case where the level of the boundary surface is lower than the upper limit level L2 in the step S4, the local controller LC1 opens the collection valve 55v and opens the collection valve 56v (step S5). Thereafter, the local controller LC1 returns to the process of the step S1. On the other hand, in the case where the level of the boundary surface is equal to or higher than the upper limit level L2 in the step S4, the local controller LC1 opens the collection valve 55v and closes the collection valve 56v (step S6). Thereafter, the local controller LC1 returns to the process of the step S1.

In this process, in the case where the level of the boundary surface is lower than the lower limit level L1, the collection valve 55v is closed. Thus, the cleaning liquid and the film removal liquid are prevented from being discharged from the collection pipe 55. In the case where the level of the boundary surface is equal to or higher than the lower limit level L1, and is lower than the upper limit level L2, the collection valves 55v, 56v are opened. Thus, the metal removal liquid is discharged from the collection pipe 55, and the cleaning liquid and the film removal liquid are discharged from the collection pipe 56. In the case where the level of the boundary surface is equal to or higher than the upper limit level L2, the collection valve 56v is closed. Thus, the metal removal liquid is prevented from being discharged from the collection pipe 56.

In this manner, in the method of collecting the removal liquids in the present embodiment, the used cleaning liquid and the used film removal liquid are separated from the used metal removal liquid based on the specific gravity of the cleaning liquid and the film removal liquid, and the specific gravity of the metal removal liquid. In this collection method, it is possible to collect the cleaning liquid and the film removal liquid completely separately from the metal removal liquid. In this case, it is not necessary for the user to perform an operation of separating the cleaning liquid and the film removal liquid from the metal removal liquid. Thus, a cost of discarding the removal liquids can be reduced.

While the collection valve 56v is inserted into the collection pipe 56 in the above-mentioned method of collecting the removal liquid, the present invention is not limited to this. In the case where the collection pipe 56 is attached to a position sufficiently higher than the upper limit level L2, and is configured such that the metal removal liquid is not discharged from the collection pipe 56, the collection valve 56v does not have to be inserted into the collection pipe 56. In this case, the process of the steps S4, S6 of FIG. 15 is not performed, and only the collection valve 55v is opened in the process of the step S5.

[7] Seventh Embodiment (1) Development Metal-Removal Unit

As for a substrate processing apparatus according to the seventh embodiment, differences from the substrate processing apparatus 100 according to the first embodiment will be described. In the present embodiment, the cleaning drying processing section 162 (the metal removal unit MR) is not provided in the cleaning drying processing block 14A of FIG. 1. Further, the below-mentioned development metal-removal unit is provided instead of the development processing unit 139 in each of the development processing chambers 31 to 34 of FIG. 2.

Figure 16:
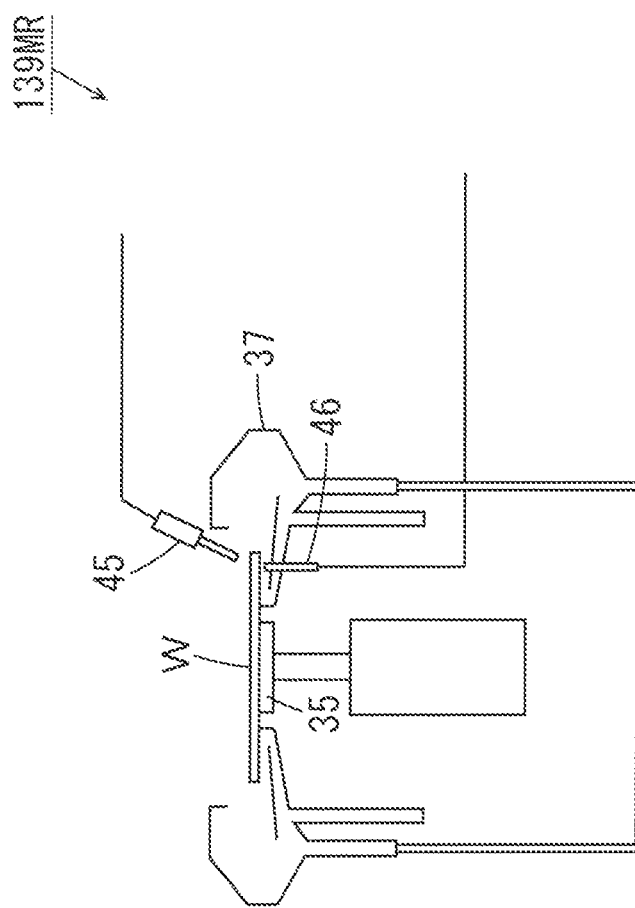
FIG. 16 is a schematic side view showing a configuration of a development metal-removal unit in a seventh embodiment of the present invention.

FIG. 16 is a schematic side view showing a configuration of the development metal-removal unit in the seventh embodiment of the present invention. As shown in FIG. 16, the development metal-removal unit 139MR includes an edge rinse nozzle 45 and a back rinse nozzle 46 corresponding to each spin chuck 35. The edge rinse nozzle 45 is arranged to be directed to a peripheral portion of a surface to be processed of a substrate W held by the spin chuck 35. The back rinse nozzle 46 is arranged to be directed to a back surface of the substrate W held by the spin chuck 35.

As for substrate processing in the present embodiment, differences from the substrate processing in the first embodiment will be described with reference to FIGS. 2, 7 and 16. As described above, the substrate W on which a resist film is formed by a first processing block 12 is placed on a substrate platform PASS5. In a second processing block 13, a transport mechanism 137 transports the substrate W placed on the substrate platform PASS5 to a development processing chamber 31 or a development processing chamber 32 using a lower hand H3.

In the development processing chambers 31, 32, the substrate W is cleaned by the development metal-removal unit 139MR. Specifically, with the substrate W rotated by a spin chuck 35, a metal removal liquid is discharged to a peripheral portion of the substrate W from the edge rinse nozzle 45. Further, the metal removal liquid is discharged to a back surface of the substrate W from the back rinse nozzle 46. In this case, a metal component remaining in the peripheral portion and the back surface of the substrate W is dissolved. Thus, the metal component remaining in the peripheral portion and the back surface of the substrate W are removed. The substrate W may be cleaned by the metal removal liquid, and then the peripheral portion and the back surface of the substrate W may be further cleaned by pure water and the like.

The substrate W is cleaned by the development metal-removal unit 139MR, and then a transport mechanism 137 transports the substrate W that has been cleaned using an upper hand H1 and a middle hand H2 from each of the development processing chambers 31, 32 to a placement buffer unit P-BF1. The subsequent substrate processing is similar to the substrate processing in the first embodiment.

Similarly, in the second processing block 13, a transport mechanism 138 transports the substrate W placed on a substrate platform PASS7 using a lower hand H3 to a development processing chamber 33 or a development processing chamber 34. Thereafter, the transport mechanism 138 transports the substrate W that has been cleaned using the upper hand H1 and the middle hand H2 from each of the development processing chambers 33, 34 to a placement buffer unit P-BF2.

(2) Effects

In the substrate processing apparatus 100 according to the present embodiment, the metal removal liquid is supplied to the peripheral portion of the surface to be processed and the back surface of the substrate W by each of the edge rinse nozzle 45 and the back rinse nozzle 46. In this case, a metal component in the metal-containing coating film in the peripheral portion of the substrate W is dissolved by the edge rinse nozzle 45, and the metal-containing coating film remains in a region except for the peripheral portion of the surface to be processed of the substrate W. Further, even in the case where the metal-containing coating liquid flows to the back surface of the substrate W, a metal component in the metal-containing coating liquid adhering to the back surface of the substrate W is removed by the back rinse nozzle 46.

In this configuration, the metal-containing coating film is formed on the surface to be processed of the substrate W except for the peripheral portion, and metal is prevented from remaining in the peripheral portion and the back surface of the substrate W. Thus, the metal-containing coating film can be formed on the substrate W, and an occurrence of metallic contamination can be prevented.

Further, in the present embodiment, the same-type of a processing liquid (TMAH, for example) can be used as the development liquid and the metal removal liquid. In this case, it is not necessary to separately collect the development liquid and the metal removal liquid. Thus, cost of discarding the processing liquid can be reduced.

Whereas, it is also possible to use different types of processing liquids as the development liquid and the metal removal liquid. For example, butyl acetate for negative-tone development processing may be used as the development liquid, and TMAH may be used as the metal removal liquid. In this case, the removal liquid collection unit 50A of FIG. 12 or 14 is preferably provided in the development metal-removal unit 139MR in order to separately collect the development liquid and the metal removal liquid.

Further, in the case where TMAH is used as the metal removal liquid, a metal component can be dissolved, and the metal-containing coating film subtly adhering to the substrate W can be integrally removed with the metal component. Thus, the metal component adhering to the peripheral portion and the back surface of the substrate W can be efficiently removed.

Further, the development processing may be performed on the exposed substrate W, a metal component may be removed from the back surface of the substrate W by the metal removal liquid during rinse processing, and then rinse processing with use of pure water and the like may be performed. Thus, a metal component that has adhered to the back surface of the substrate W during the development processing can be reliably removed.

[8] Other Embodiments (1) While a metal component is contained in both of the anti-reflection liquid and the resist liquid in the above-mentioned embodiment, the present invention is not limited to this. One of the anti-reflection liquid and the resist liquid does not have to contain a metal component. In this case, in the fifth and sixth embodiments, the coating metal-removal unit 129MR is not provided, and the coating processing unit 129 is provided in one of the coating processing chambers 21, 23 or one of the coating processing chambers 22, 24.

(2) While a metal component is contained in the anti-reflection liquid and the resist liquid as the coating liquid in the above-mentioned embodiment, the present invention is not limited to this. For example, a metal component may be contained in the coating liquid for forming a hardmask film (HM). In this case, titanium oxide ($TiO_x$), tungsten oxide ($WO_x$) or zirconium oxide ($ZrO_x$), for example, is contained in the coating liquid as the metal component.

(3) In the above-mentioned embodiment, the two spin chucks 25 are provided in each of the coating processing chambers 21 to 24, and three spin chucks 35 are provided in each of the development processing chambers 31 to 34. However, the present invention is not limited to this. One, three or more than three spin chucks 25 may be provided in each of the coating processing chambers 21 to 24. Further, two or less than two spin chucks 35, or four or more than four spin chucks 35 may be provided in each of the development processing chambers 31 to 34.

Figure 17:
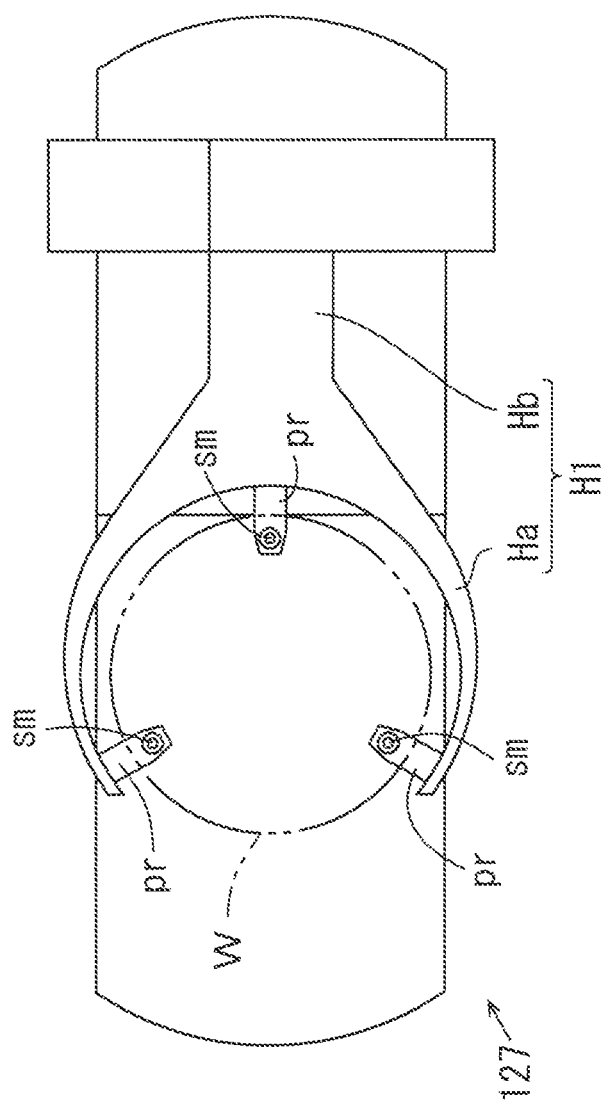
FIG. 17 is a plan view showing a suction-type hand of a transport mechanism.

(4) While the hands H1 to H3 of each of the transport mechanisms 127, 128, 137, 138, 141 hold the outer periphery of the substrate W in the above-mentioned embodiment, the present invention is not limited to this. The hands H1 to H3 of each of the transport mechanisms 127, 128, 137, 138, 141 may hold the back surface of the substrate W by suction. FIG. 17 is a plan view showing a suction-type hand H1 of the transport mechanism 127. Suction-type hands H2, H3 have a configuration similar to that of the suction-type hand H1 of FIG. 17.

As shown in FIG. 17, the suction-type hand H1 includes a guide portion Ha and an arm portion Hb. The guide portion Ha is substantially C-shaped, and the arm portion Hb is oblong. At an inner periphery of the guide portion Ha, a plurality (three in the present example) of projections pr are formed to be directed inward of the guide portion Ha at equal angular intervals about a center of a circle formed along the inner periphery of the guide portion Ha. A suction portion sm is provided at a tip end of each projection pr. Each suction portion sm is connected to an intake system (not shown).

In the hand H1, the substrate W is placed on the three suction portions sm of the three projections pr. In FIG. 17, the substrate W held by the hand H1 is indicated by a two-dots and dash line. In this state, the intake system connected to the three suction portions sm is controlled, and portions at three locations of the back surface of the substrate W are respectively sucked by the three suction portions sm. Thus, the back surface of the substrate W is held. The hand H1 may have four suction portions sm. In this case, portions at four locations of the back surface of the substrate W are respectively sucked by the four suction portions sm.

(5) While it is preferable that each of the transport mechanisms 127, 128, 137, 138, 141 has the three hands H1 to H3 in each of the first to fourth embodiments, the present invention is not limited to this. Each of the transport mechanisms 127, 128, 137, 138, 141 may have two hands or less than two hands, or may have four or more than four hands.

Specifically, in the case where the substrate W is held by the suction-type hand shown in FIG. 17, if the metal-containing coating liquid is not adhering to the back surface of the substrate W, it is not necessary for each of the transport mechanisms 127, 128, 137, 138, 141 to have three or more than three hands. Further, it is not necessary for each of the transport mechanisms 127, 128, 137, 138, 141 to separately use a hand for holding the substrate W that has not been cleaned and a hand for holding the substrate W that has been cleaned depending on whether the substrate W has been cleaned.

In the second embodiment, it is not necessary for each of the transport mechanisms 137, 138 to have three or more than three hands. Further, it is not necessary for each of the transport mechanisms 137, 138 to use a hand for holding the substrate W that has not been cleaned or a hand for holding the substrate W that has been cleaned depending on whether the substrate W has been cleaned. In the third embodiment, it is not necessary for each of the transport mechanisms 137, 138, 141 to have three or more than three hands. Further, it is not necessary for each of the transport mechanisms 137, 138, 141 to use a hand for holding the substrate W that has not been cleaned or a hand for holding the substrate W that has been cleaned depending on whether the substrate W has been cleaned. In the fifth and sixth embodiments, it is not necessary for each of the transport mechanisms 127, 128, 137, 138, 141 to have three or more than three hands. Further, it is not necessary for each of the transport mechanisms 127, 128, 137, 138, 141 to use a hand for holding the substrate W that has not been cleaned or a hand for holding the substrate W that has been cleaned depending on whether the substrate W has been cleaned.

(6) In the first to fourth embodiments, the plurality of cleaning drying processing units BSS are arranged in the cleaning drying processing section 161, and the plurality of metal removal units MR are arranged in the cleaning drying processing section 162. However, the present invention is not limited to this. Part or all of the cleaning drying processing units BSS may be arranged in the cleaning drying processing section 162. Part or all of the metal removal units MR may be arranged in the cleaning drying processing section 161.

(7) While the edge rinse nozzle 41 is provided in the coating processing unit 129 in the first to fourth embodiments, the present invention is not limited to this. The edge rinse nozzle 41 does not have to be provided in the coating processing unit 129. Alternatively, the edge rinse nozzle 41 does not have to be provided in the coating processing unit 129, but may be provided in the metal removal unit MR. In this case, a removal liquid collection unit similar to the removal liquid collection unit in the fifth or sixth embodiment may be provided in the metal removal unit MR.

Similarly, in the fifth and the sixth embodiments, the edge rinse nozzle 41 and the back rinse nozzle 42 are provided in the coating metal-removal unit 129MR. However, the present invention is not limited to this. One or both of the edge rinse nozzle 41 and the back rinse nozzle 42 do not have to be provided in the coating metal-removal unit 129MR.

(8) While the edge rinse nozzle 41 for discharging the film removal liquid and the edge rinse nozzle 43 for discharging the metal removal liquid are separately provided in the coating metal-removal unit 129MR in the fifth and sixth embodiments, the present invention is not limited to this. A common edge rinse nozzle for selectively discharging the film removal liquid and the metal removal liquid may be provided in the coating metal-removal unit 129MR.

Similarly, the back rinse nozzle 42 for discharging the cleaning liquid and the back rinse nozzle 44 for discharging the metal removal liquid are separately provided in the coating metal-removal unit 129MR. However, the present invention is not limited to this. A common back rinse nozzle for selectively discharging the cleaning liquid and the metal removal liquid may be provided in the coating metal-removal unit 129MR.

Alternatively, the metal removal liquid may have property of dissolving the coating liquid. In this case, neither the edge rinse nozzle 41 nor the back rinse nozzle 42 have to be provided in the coating metal-removal unit 129MR. Further, the removal liquid collection unit does not have to be provided in the coating metal-removal unit 129MR.

In the case where the metal removal liquid has property of dissolving the coating liquid, the metal and the coating liquid in the metal-containing coating liquid are simultaneously removed by the single removal liquid. Thus, the metal and the coating liquid adhering to the peripheral portion and the back surface of the substrate W can be efficiently removed. Further, it is not necessary to separately collect the removal liquid. As a result, cost of processing the substrate W can be reduced.

(9) While the coating metal-removal unit 129MR includes the removal liquid collection unit 50A of FIGS. 12 and 14 in each of the fifth and sixth embodiments, the present invention is not limited to this. For example, in the case where the cup 27 is a two-layer cup capable of separately collecting two types of removal liquids, the coating metal-removal unit 129MR does not have to include the removal liquid collection unit 50A of FIGS. 12 and 14. In this case, the cup 27 functions as the removal liquid collection unit 50A.

(10) While the edge exposure unit EEW is provided in the interface block 14 in each of the first, second, third, fifth and the sixth embodiments, the present invention is not limited to this. The edge exposure unit EEW does not have to be provided in the interface block 14, and may be provided in each of the upper thermal processing section 301 and the lower thermal processing section 302 of the first processing block 12. In this case, the resist film is formed, and then the edge exposure processing is performed on the substrate W before the substrate W is placed on each of the substrate platforms PASS5, PASS7.

Figure 18:
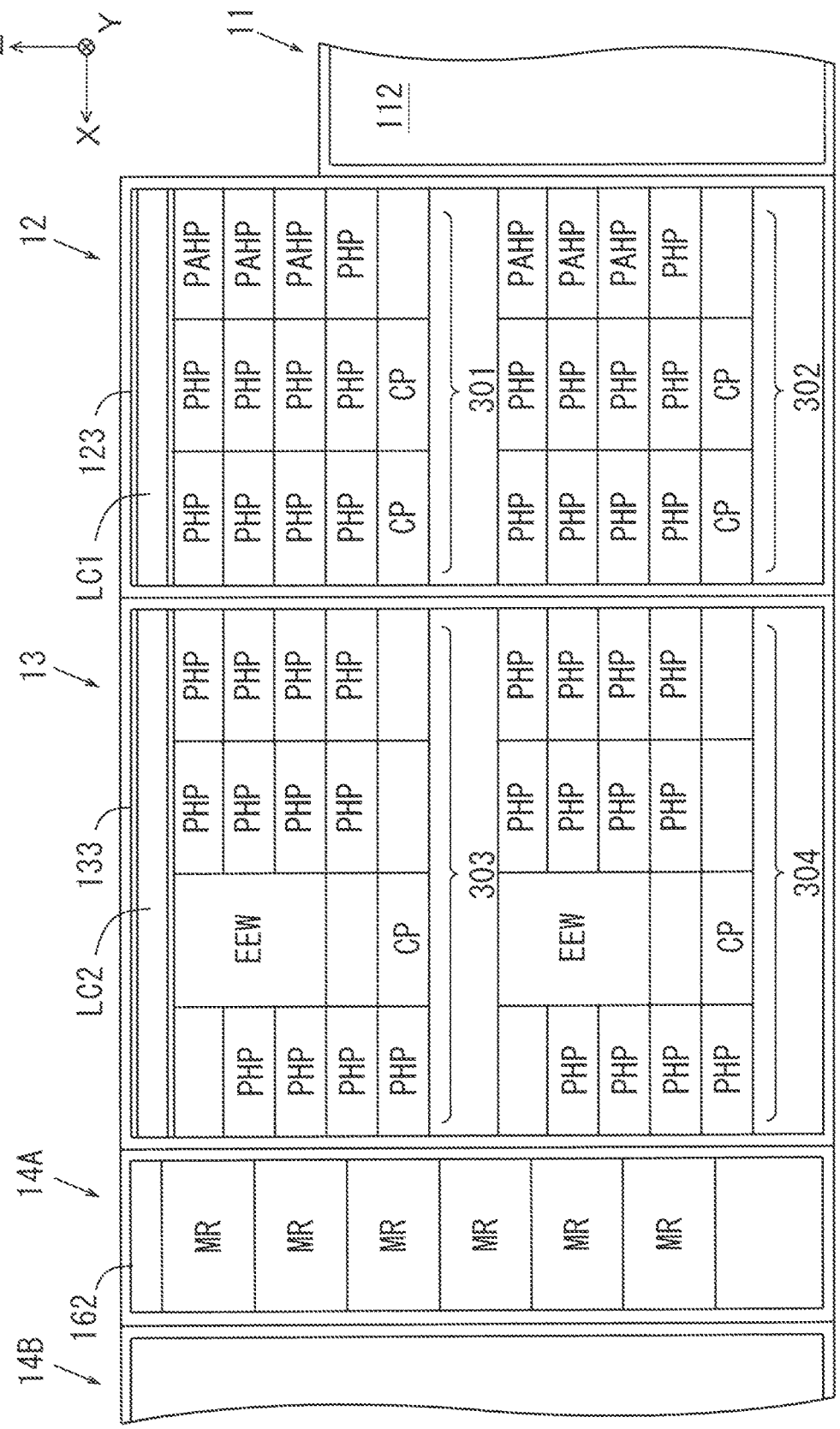
FIG. 18 is a schematic side view showing inner configurations of thermal processing sections and a cleaning drying processing section in another embodiment.
Figure 19:
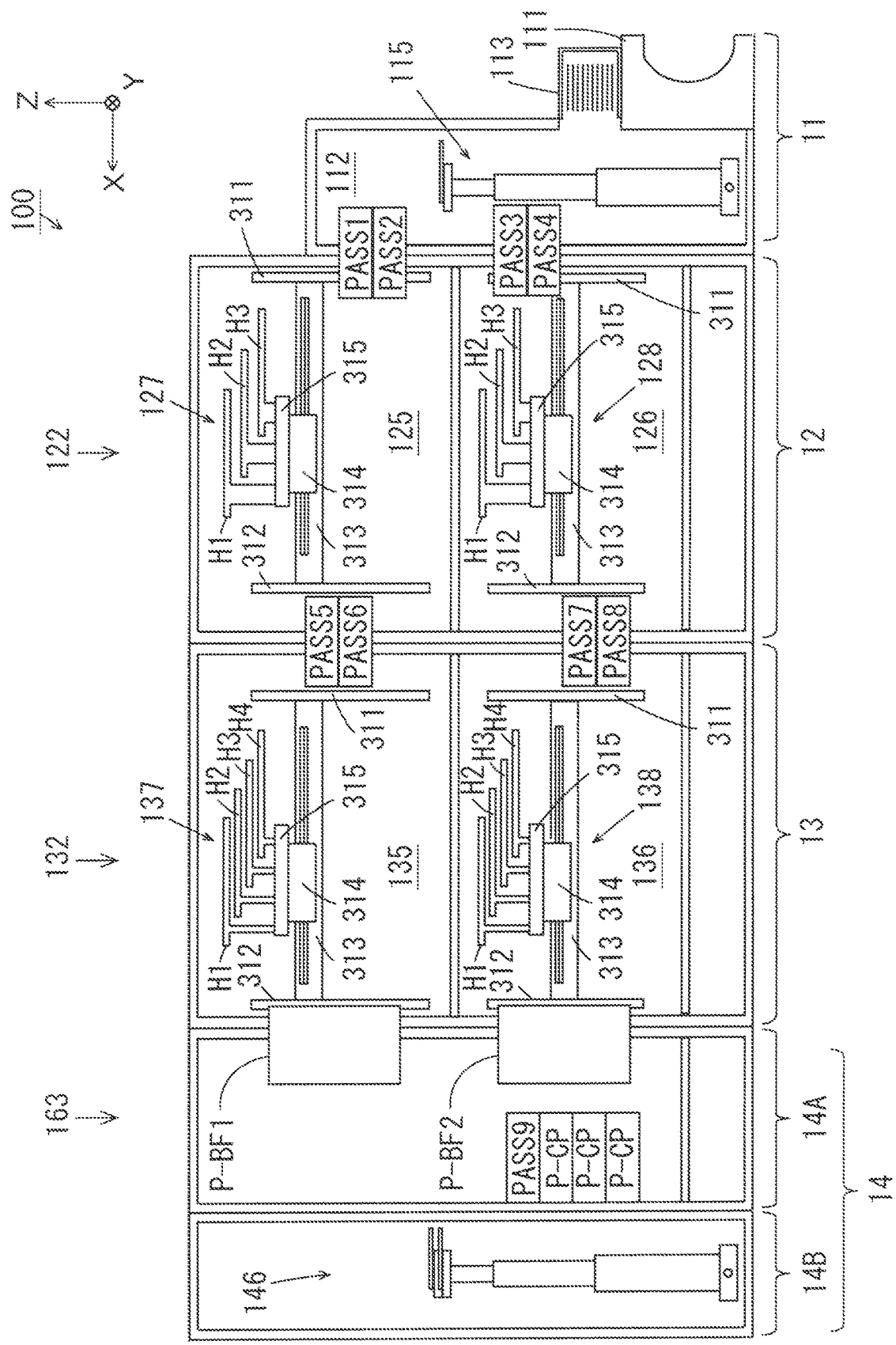
FIG. 19 is a schematic side view showing inner configurations of transport sections in another embodiment.

Alternatively, the edge exposure unit EEW may be provided in the second processing block 13. In this case, in the first to third embodiments, each of the transport mechanisms 137, 138 of the second processing block 13 preferably has a fourth hand in addition to the hands H1 to H3. FIG. 18 is a schematic side view showing inner configurations of thermal processing sections 123, 133 and a cleaning drying processing section 162 in another embodiment. FIG. 19 is a schematic side view showing inner configurations of transport sections 122, 132, 163 in the other embodiment.

As shown in FIGS. 18 and 19, in the present embodiment, the edge exposure unit EEW is not provided in the interface block 14, and is provided in each of the upper thermal processing section 303 and the lower thermal processing section 304 in the second processing block 13. Further, as shown in FIG. 19, each of the transport mechanisms 137, 138 of the second processing block 13 has a hand H4 in addition to the hands H1 to H3. The hand H4 is positioned below the hand H3. As for the substrate processing in the other embodiment, differences from the substrate processing in the first embodiment will be described below with references to FIGS. 1, 2, 18 and 19.

As described above, the substrate W on which a resist film is formed by the first processing block 12 is placed on the substrate platform PASS5. In the second processing block 13, the transport mechanism 137 sequentially transports the substrate W on which a resist film has been formed and which is placed on the substrate platform PASS5 to the edge exposure unit EEW (FIG. 18) and the placement buffer unit P-BF1 (FIG. 19) using the two lower hands H3, H4. In this case, the edge exposure processing is performed on the substrate W in the edge exposure unit EEW. The substrate W on which the edge exposure processing has been performed is placed on the placement buffer unit P-BF1.

Further, the transport mechanism 137 (FIG. 19) takes out the substrate W on which the exposure processing and the thermal processing have been performed from the thermal processing unit PHP (FIG. 18) adjacent to the cleaning drying processing block 14A using the two upper hands H1, H2. The transport mechanism 137 sequentially transports the substrate W to the cooling unit CP (FIG. 18), any one of the development processing chambers 31, 32 (FIG. 2), the thermal processing unit PHP (FIG. 18) and the substrate platform PASS6 (FIG. 19) using the hands H1, H2.

Similarly, the transport mechanism 138 (FIG. 19) sequentially transports the substrate W on which the resist film has been formed and which is placed on the substrate platform PASS7 to the edge exposure unit EEW (FIG. 18) and the placement buffer unit P-BF2 (FIG. 19) using the two lower hands H3, H4. Further, the transport mechanism 138 (FIG. 19) takes out the substrate W on which the exposure processing and the thermal processing have been performed from the thermal processing unit PHP (FIG. 18) adjacent to the interface block 14 using the two upper hands H1, H2. The transport mechanism 138 sequentially transports the substrate W to the cooling unit CP (FIG. 18), any one of the development processing chambers 33, 34 (FIG. 2), the thermal processing units PHP (FIG. 18) and the substrate platform PASS8 (FIG. 19) using the two upper hands H1, H2.

In this configuration, the substrate W is transported from the first processing block 12 to the interface block 14 with use of the two lower hands H3, H4. On the other hand, the substrate W is transported from the interface block 14 to the first processing block 12 with use of the two upper hands H1, H2. Therefore, it is possible to improve throughput while using the hands H3, H4, for holding the substrate W that has not been cleaned, separately from the hands H1, H2 for holding the substrate W that has been cleaned.

(11) While the cleaning drying processing section 162 (the metal removal unit MR) is provided in the cleaning drying processing block 14A in the first embodiment, the present invention is not limited to this. The cleaning drying processing section 162 may be provided in the second processing block 13.

In this case, the transport mechanism 137 transports the substrate W on which a resist film has been formed and which is placed on the substrate platform PASS5 to the cleaning drying processing section 162 using the lower hand H3. Thus, a metal component remaining in the peripheral portion and the back surface of the substrate W is removed by the metal removal unit MR in the cleaning drying processing section 162. The substrate W is cleaned by the metal removal unit MR, and then the transport mechanism 137 transports the substrate W that has been cleaned from the cleaning drying processing section 162 to the placement buffer unit P-BF1 using the upper hand H1 and the middle hand H2.

(12) While the edge rinse nozzle 45 is provided in the development metal-removal unit 139MR in the seventh embodiment, the present invention is not limited to this. In the case where the slit nozzle 38 of FIG. 1 can discharge the metal removal liquid to the peripheral portion of the surface to be processed of the substrate W, the edge rinse nozzle 45 does not have to be provided in the development metal-removal unit 139MR. In this case, the size of the substrate processing apparatus 100 can be inhibited from increasing.

[9] Correspondences Between Constituent Elements in Claims and Parts in Preferred Embodiments In the following paragraphs, non-limiting examples of correspondences between various elements recited in the claims below and those described above with respect to various preferred embodiments of the present invention are explained.

In the above-mentioned embodiment, the substrate W is an example of a substrate, the metal removal unit MR or the development metal-removal unit 139MR is an example of a peripheral portion removal unit, and the transport mechanisms 127, 128, 137, 138, 141 are examples of a transport mechanism. The substrate processing apparatus 100 is an example of a substrate processing apparatus. The spin chuck 25 is an example of a first or third rotation holder, the spin chuck 3 or the spin chuck 35 is an example of a second rotation holder, and the coating liquid nozzle 28 is an example of a coating liquid nozzle.

The thermal processing section 123 is an example of a thermal processing section, the gas supplier 9 or the gas nozzle 10b is an example of a gas discharger, the hands H2, H3 of the transport mechanisms 127, 128 or the hands H3 of the transport mechanisms 137, 138, 141 are examples of a pre-removal substrate holder. The hands H1 of the transport mechanisms 127, 128 or the hands H1, H2 of the transport mechanisms 137, 138, 141 are examples of a post-removal substrate holder, the removal liquid collection unit 50A is an example of a removal liquid collection unit, and the slit nozzle 38 is an example of a development nozzle.

The collection tanks 53b, 53a are examples of first and second collectors, respectively, the cup 27, the branch pipes 51, 52, the collection valves 51v, 52v and the local controller LC1 are examples of a switching path. The cup 27 is an example of a cup, the branch pipes 52, 51 are examples of the first and second collection pipes, respectively, the collection valves 52v, 51v are examples of the first and second collection valves, respectively and the local controller LC1 is an example of a controller.

The collection tank 53 is an example of a storage, the cup 27, the collection pipe 50, the boundary detector 54, the collection pipes 55, 56, the collection valves 55v, 56v and the local controller LC1 are examples of a removal liquid separating mechanism, and the collection pipe 50 is an example of a collection pipe. The collection pipes 55, 56 are examples of first and second discharge pipes, respectively, the collection valves 55v, 56v are examples of the first and second discharge valves, respectively, the boundary detector 54 is an example of a boundary surface detector, the lower limit level L1 is an example of a lower limit position, and the upper limit level L2 is an example of an upper limit position.

In the first to fourth embodiments, the coating processing unit 129 is an example of a film formation unit, and the peripheral portion cleaning nozzle 8 or the liquid nozzle 10a is an example of a first removal liquid nozzle. The edge rinse nozzle 41 is an example of a second removal liquid nozzle, and the back surface cleaning nozzle 7 is an example of a third removal liquid nozzle.

In the fifth and sixth embodiments, the coating metal-removal unit 129MR is an example of a film formation unit, and the edge rinse nozzles 41, 43 and the supply valves 41v, 43v are examples of a peripheral portion removal liquid supply unit. The edge rinse nozzles 41, 43 are examples of a removal liquid nozzle, the back rinse nozzles 42, 44 and the supply valves 42v, 44v are examples of a back surface removal liquid supply units. In the seventh embodiment, the edge rinse nozzle 45 is an example of a first removal liquid nozzle.

As each of constituent elements recited in the claims, various other elements having configurations or functions described in the claims can be also used.

INDUSTRIAL APPLICABILITY

The present invention can be effectively utilized for processing for various types of substrates.

The invention claimed is:
1. A film formation method comprising:
holding and rotating a substrate in a horizontal attitude by a rotation holder;
discharging a coating liquid containing metal as a metal-containing coating liquid to a surface to be processed of the substrate rotated by the rotation holder using a coating liquid nozzle; and
supplying a liquid for dissolving the metal-containing coating liquid to a peripheral portion of the surface to be processed of the substrate rotated by the rotation holder using a peripheral portion removal liquid supply unit such that a metal-containing coating film remains in a region except for the peripheral portion of the surface to be processed of the substrate,
wherein the liquid for dissolving the metal-containing coating liquid includes an aqueous solution containing tetra methyl ammonium hydroxide or an aqueous solution containing a chelate agent as a first removal liquid.

2. The film formation method according to claim 1, wherein
the liquid for dissolving the metal-containing coating liquid further includes a second removal liquid for dissolving the coating liquid, and
the supplying a liquid for dissolving the metal-containing coating liquid using a peripheral portion removal liquid supply unit includes supplying the first and second removal liquids to the peripheral portion of the surface to be processed of the substrate by one or a plurality of removal liquid nozzles.

3. The film formation method according to claim 2, further comprising separately collecting the first removal liquid that has been discharged to the substrate and the second removal liquid that has been discharged to the substrate by a removal liquid collection unit.

4. The film formation method according to claim 3, wherein
the removal liquid collection unit includes
a first collector that collects the first removal liquid,
a second collector that collects the second removal liquid, and
a switching path that is switched to lead the first removal liquid and the second removal liquid, which have been discharged to the substrate to the first collector and the second collector, respectively, the supplying the first and second removal liquids to the peripheral portion of the surface to be processed of the substrate includes discharging the first and second removal liquids, respectively, in first and second periods that are different from each other, and the collecting includes switching the switching path such that the first removal liquid, which has been discharged to the substrate in the first period is led to the first collector and the second removal liquid, which has been discharged to the substrate in the second period is led to the second collector.

5. The film formation method according to claim 4, wherein
the switching path includes
a cup for receiving the first and second removal liquids splashed from the substrate,
a first collection pipe connected between the cup and the first collector,
a second collection pipe connected between the cup and the second collector,
a first collection valve inserted into the first collection pipe, and
a second collection valve inserted into the second collection pipe, and
the switching the switching path includes opening the first collection valve in order for the first removal liquid to be collected in the first collector and closing the second collection valve, and opening the second collection valve in order for the second removal liquid to be collected in the second collector and closing the first collection valve.

6. The film formation method according to claim 3, wherein
specific gravity of the first removal liquid is larger than specific gravity of the second removal liquid,
the removal liquid collection unit includes a storage that stores the first and second removal liquids, and
the collecting includes separating the first and second removal liquids stored in the storage based on specific gravity by a removal liquid separating mechanism.

7. The film formation method according to claim 6, wherein
the removal liquid separating mechanism includes
a cup that receives the first and second removal liquids splashed from the substrate,
a collection pipe connected between the cup and the storage,
a first discharge pipe provided to discharge the first removal liquid from the storage,
a second discharge pipe provided to discharge the second removal liquid from the storage,
a first discharge valve inserted into the first discharge pipe, and
a boundary surface detector that detects a boundary surface between the first removal liquid and the second removal liquid stored in the storage, the separating includes acquiring the boundary surface detected by the boundary surface detector, closing the first discharge valve in a case where the acquired boundary surface is equal to or lower than a predetermined lower limit position, and opening the first discharge valve in a case where the acquired boundary surface is higher than the lower limit position, and the first discharge pipe is connected to the storage lower than the lower limit position, and the second discharge pipe is connected to the storage higher than the lower limit position.

8. The film formation method according to claim 7, wherein the removal liquid separating mechanism further includes a second discharge valve inserted into the second discharge pipe, and the separating further includes opening the second discharge valve in a case where the acquired boundary surface is equal to or lower than a predetermined upper limit position, which is higher than the lower limit position, and closing the second discharge valve in a case where the acquired boundary surface is higher than the upper limit position.

9. The film formation method according to claim 1, wherein the liquid for dissolving the metal-containing coating liquid dissolves the metal and the coating liquid.

10. The film formation method according to claim 1, further comprising supplying a removal liquid for dissolving the metal-containing coating liquid to a back surface, which is opposite to the surface to be processed of the substrate, rotated by the rotation holder using a back surface removal liquid supply unit.

11. A film formation method comprising:

holding and rotating a substrate in a horizontal attitude by a rotation holder;

discharging a coating liquid containing metal as a metal-containing coating liquid to a surface to be processed of the substrate rotated by the rotation holder using a coating liquid nozzle;

discharging a second removal liquid for dissolving the coating liquid to a peripheral portion of the surface to be processed of the rotated substrate from a second removal liquid nozzle; and discharging a first removal liquid for dissolving the metal to the peripheral portion of the surface to be processed of the rotated substrate from a first removal liquid nozzle such that a metal-containing coating film remains in a region except for the peripheral portion of the surface to be processed of the substrate after the coating liquid on the peripheral portion to be processed of the substrate is dissolved by the second removal liquid.

* * * * *